(12) United States Patent
Wang et al.

(10) Patent No.: US 11,961,923 B2
(45) Date of Patent: Apr. 16, 2024

(54) SOLAR CELL AND ELECTRONIC DEVICE

(71) Applicant: Huawei Technologies Co., Ltd., Shenzhen (CN)

(72) Inventors: Shuo Wang, Shanghai (CN); Kai Xin, Shanghai (CN); Yunfeng Liu, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/725,310

(22) Filed: Apr. 20, 2022

(65) Prior Publication Data

US 2022/0344524 A1 Oct. 27, 2022

(30) Foreign Application Priority Data

Apr. 21, 2021 (CN) .......................... 202110434235.1

(51) Int. Cl.
*H01L 31/0224* (2006.01)
*H01L 31/046* (2014.01)
*H01L 31/054* (2014.01)

(52) U.S. Cl.
CPC ............... *H01L 31/022425* (2013.01); *H01L 31/022466* (2013.01); *H01L 31/046* (2014.12); *H01L 31/0543* (2014.12)

(58) Field of Classification Search
CPC ..... H01L 31/022425; H01L 31/022466; H01L 31/046; H01L 31/0543
See application file for complete search history.

(56) References Cited

U.S. PATENT DOCUMENTS

| 4,647,711 A * | 3/1987 | Basol ...................... H01L 31/18 427/76 |
| 2015/0270419 A1* | 9/2015 | Yuda ............... H01L 31/022425 438/98 |

(Continued)

FOREIGN PATENT DOCUMENTS

| CN | 101218536 A | 7/2008 |
| CN | 103412662 A | 11/2013 |

(Continued)

*Primary Examiner* — Mayla Gonzalez Ramos
(74) *Attorney, Agent, or Firm* — Leydig, Voit & Mayer, Ltd.

(57) ABSTRACT

A solar cell is provided, including a front electrode, a functional layer, and a back electrode. The front electrode is an electrode on a side of an illuminated surface. The front electrode includes a high-conductivity region and a low-conductivity region that are adjacent to each other, or the back electrode includes a high-conductivity region and a low-conductivity region that are adjacent to each other. The front electrode and/or the back electrode may be designed to be separated by region, and conductivity of one conductive region is designed to be higher than conductivity of the other conductive region. According to the application, a film rectangular resistance loss caused by large-scale non-uniform lateral transfer of a photocurrent is avoided, thereby improving photoelectric conversion efficiency of the cell, and improving the cell comprehensive performance by flexibly selecting materials based on different requirements of different regions in different application scenarios.

20 Claims, 9 Drawing Sheets

(56) References Cited

U.S. PATENT DOCUMENTS

2015/0325717 A1* 11/2015 Namboshi ............. H01L 31/048
716/136
2016/0126391 A1   5/2016 Sun et al.
2018/0231804 A1*  8/2018 Bishop ................ H01L 31/0468
2018/0277692 A1*  9/2018 Shiokawa ....... H01L 31/022466

FOREIGN PATENT DOCUMENTS

| | | |
|---|---|---|
| CN | 104345514 A | 2/2015 |
| CN | 107978646 A | 5/2018 |
| CN | 109065757 A | 12/2018 |
| CN | 113284957 A | 8/2021 |
| JP | 2004247595 A | 9/2004 |
| JP | 2014072492 A | 4/2014 |
| TW | 201246578 A | 11/2012 |

* cited by examiner

SOLAR CELL AND ELECTRONIC DEVICE

CROSS-REFERENCE TO RELATED APPLICATIONS

This application claims priority to Chinese Patent Application No. 202110434235.1, filed on Apr. 21, 2021, which is hereby incorporated by reference in its entirety.

TECHNICAL FIELD

Embodiments of this application relate to the field of energy technologies, and in particular, to a solar cell and an electronic device thereof.

BACKGROUND

In recent years, smart glasses in which conventional sun glasses or optical glasses are combined with Bluetooth, audio, and convenient man-machine interaction become more popular among consumers. However, with development and integration of more diversified functions of the smart glasses, a contradiction between the functions and battery lives of the smart glasses becomes more prominent, and battery life anxieties of the consumers are increased.

A thin-film solar cell has excellent characteristics such as high efficiency, lightness, thinness, flexibility, transparency, and color adjustability, and is a good power supply device choice for a wearable smart device, for example, a pair of smart glasses. For a single lens with an area of 20 $cm^2$ to 30 $cm^2$ in a pair of smart glasses, if an available power of tens to hundreds of milliwatts can be obtained under standard illuminance, a power consumption requirement of the pair of smart glasses can be basically met, to ensure real-time available energy and eliminate the battery life anxieties of the consumers. However, up to now, a size of a thin-film solar cell device that has high photoelectric conversion efficiency is basically at a laboratory device level of about 0.1 $cm^2$. With an increase in an effective area of the device, the photoelectric conversion efficiency rapidly decreases due to an influence of a film rectangular resistance of an electrode. Consequently, a power requirement of a lens of a pair of smart glasses with a large area size cannot be met. For example, it is reported in a literature that when a small-area battery device with an average transmittance of 24% and a size of 0.24 $cm^2$ is enlarged to a lens size of 15.5 $cm^2$, photoelectric conversion efficiency is reduced by 80 times under a standard illuminance condition. Therefore, it is necessary to provide a method for improving photoelectric conversion efficiency of a large-area solar cell, to resolve a problem of a short battery life of a pair of smart glasses, and promote application of a thin-film solar cell in the field of wearable smart devices.

SUMMARY

In view of this, embodiments of this application provide a solar cell. The solar cell can effectively reduce a film rectangular resistance loss of an electrode, and has high photoelectric conversion efficiency when having a large area size (for example, 20 $cm^2$ to 30 $cm^2$). The solar cell can improve a battery life when being used in a pair of smart glasses, thereby effectively resolving a problem of a short battery life of the pair of smart glasses.

According to a first aspect, an embodiment of this application provides a solar cell. The solar cell includes a front electrode and a back electrode that are disposed opposite to each other and a functional layer disposed between the front electrode and the back electrode, where the front electrode is an electrode on a side of an illuminated surface, and the front electrode includes a high-conductivity region and a low-conductivity region that are adjacent to each other or the back electrode includes a high-conductivity region and a low-conductivity region that are adjacent to each other. In the solar cell in this embodiment of this application, the front electrode and/or the back electrode may be designed to be separated by region, and conductivity of one conductive region is designed to be higher than conductivity of the other conductive region. This is conducive to convergence of photoelectrons from the region with low conductivity to the region with high conductivity, so that lateral transfer of the photoelectrons in an entire region of the front electrode and/or the back electrode becomes more uniform. Therefore, a film rectangular resistance loss caused by large-scale non-uniform lateral transfer of a photocurrent is effectively avoided, photoelectric conversion efficiency of the cell is improved, and in particular, efficiency of a large-area solar cell is significantly improved. In addition, cell comprehensive performance can be improved by flexibly selecting materials, region width setting, and the like based on different requirements for cell performance, for example, transparency, in different application scenarios. In this application, "high" and "low" in the so-called high-conductivity region and low-conductivity region represent a relative concept between the two, represent relative levels of conductive performance of the conductive regions, and does not represent absolute levels of the conductive performance of the conductive regions. The high-conductivity region and the low-conductivity region are relative, to be specific, if there are two regions with different conductivities in an electrode, a region with high relative conductivity is a high-conductivity region and a region with low relative conductivity is a low-conductivity region.

For convenience of distinguishing, in the following, the low-conductivity region of the front electrode is denoted as a conductive region A, the high-conductivity region of the front electrode is denoted as a conductive region B, the low-conductivity region of the back electrode is denoted as a conductive region C, the low-conductivity region of the back electrode is denoted as a conductive region D, and conductivities of the high-conductivity regions are higher than conductivities of the low-conductivity regions. In some implementations of this application, the conductive region B is disposed around the conductive region A, and/or the conductive region D is disposed around the conductive region C. In the design of the front electrode and/or the back electrode separated by region, an internal conductive region is surrounded by an external conductive region, and conductivity of the external conductive region is designed to be higher than conductivity of the internal conductive region. In this way, the external high-conductivity region uniformly and efficiently extracts a photocurrent in the internal conductive region from all sides, to effectively avoid the film rectangular resistance loss caused by large-scale non-uniform lateral transfer of the photocurrent, and improve the photoelectric conversion efficiency of the cell.

In an implementation of this application, the conductive region B is disposed around the conductive region A, and is in close contact with and electrically connected to the conductive region A. In other words, the conductive region B is adjacent to the conductive region A, the conductive region B surrounds the conductive region A, and the conductive region B is configured to converge a photocurrent of the conductive region A. The conductive region B may partially surround the conductive region A, or may completely surround the conductive region A. The conductive region D is disposed around the conductive region C, and is in close contact with and electrically connected to the conductive region C. In other words, the conductive region D is adjacent to the conductive region C, the conductive region D surrounds the conductive region C, and the conductive region D is configured to converge a photocurrent of the conductive region C. The conductive region D may partially surround the conductive region C, or may completely surround the conductive region C. Both the foregoing partial surrounding and complete surrounding are conducive to convergence of the photoelectrons, that is, conducive to convergence of the photoelectrons from the low-conductivity region to the high-conductivity region, so that lateral transfer of the photoelectrons on the entire region of the front electrode or the back electrode becomes more uniform. This is conducive to reducing the film rectangular resistance loss, and improving the photoelectric conversion efficiency of the cell. Preferably, when complete surrounding is implemented, convergence efficiency of the photoelectrons is the highest. This is more conducive to avoiding the film rectangular resistance loss caused by the large-scale non-uniform lateral transfer of the photocurrent, and improving the photoelectric conversion efficiency of the cell. In an implementation of this application, a material, a thickness, a region size, and the like of the conductive region B that is in the front electrode and that is located at an external part and a material, a thickness, a region size, and the like of the conductive region D that is in the back electrode and that is located at an external part may be set based on an actual application requirement. Usually, when the front electrode is used as a side of the illuminated surface, a width of the external high-conductivity region B is as narrow as possible when a specific photocurrent convergence effect is ensured, thereby reducing an incident light loss of the solar cell.

In an implementation of this application, the conductive region A may be transparent, and the conductive region C may be transparent or semi-transparent. The conductive region B may be transparent, semi-transparent, or opaque. The conductive region D may be transparent, semi-transparent, or opaque. Transparency of each conductive region may be adjusted by adjusting a material and/or a thickness of each film layer of a corresponding conductive region.

In an implementation of this application, the conductive region A includes a transparent colloidal layer and a first conductive mesh layer embedded in the transparent colloidal layer, or includes a transparent conductive oxide layer and a first conductive mesh layer embedded in the transparent conductive oxide layer, where the first conductive mesh layer is electrically connected to the functional layer. By using a conductive mesh structure, the conductive region A can maintain high transparency while obtaining conductivity. In addition, compared with a conventional transparent electrode simply using a transparent conductive oxide, a film rectangular resistance of the electrode can be greatly reduced, specifically, by one to two orders of magnitude. In an implementation of this application, a material of the transparent colloidal layer may be a colloidal material formed through curing from a liquid state, and the material is transparent after being cured. The material includes but is not limited to a thermoplastic polymer, a photocurable polymer, and a thermosetting polymer. A material of the transparent conductive oxide layer is a transparent conductive oxide, and the transparent conductive oxide (TCO) is a thin film material with high transmittance and low resistivity in a visible light spectrum range (a wavelength is 380 nm to 780 nm). The TCO thin film material includes but is not limited to indium tin oxide ITO, fluorine-doped tin oxide FTO, aluminum-doped zinc oxide AZO, gallium-doped zinc oxide GZO, and boron-doped zinc oxide BZO.

In an implementation of this application, the conductive region B includes the transparent colloidal layer and a second conductive mesh layer embedded in the transparent colloidal layer, or includes the transparent conductive oxide layer and a second conductive mesh layer embedded in the transparent conductive oxide layer, where the second conductive mesh layer is electrically connected to the functional layer.

In another implementation of this application, the conductive region B includes one or more of a metal layer or an alloy layer, a metal nanowire, graphene, a carbon nanotube, or a conductive polymer. The metal or alloy layer may include one or more of gold, silver, nickel, copper, aluminum, or the like. The metal or alloy layer may be of a single-layer structure including one metal or alloy, or may be of a multi-layer structure including a plurality of different metals or alloys.

In some implementations of this application, the conductive region A and the conductive region B each use a conductive mesh structure, that is, the entire front electrode uses a conductive mesh structure. In this way, the conductive region A and the conductive region B of the front electrode may be simultaneously manufactured by using a one-step molding process, to simplify a process flow. In this implementation, to make the conductivity of the conductive region B higher than the conductivity of the conductive region A, a conductivity difference may be implemented by designing the first conductive mesh layer and the second conductive mesh layer differently, and a specific design manner is not limited. In some implementations of this application, area coverage of the second conductive mesh layer in the conductive region B is greater than area coverage of the first conductive mesh layer in the conductive region A. In another implementation of this application, a mesh line depth-to-width ratio of the second conductive mesh layer is greater than a mesh line depth-to-width ratio of the first conductive mesh layer. The area coverage of the second conductive mesh layer in the conductive region B refers to a percentage of an area occupied by the second conductive mesh layer in the conductive region B to a total area of the conductive region B. Similarly, the area coverage of the first conductive mesh layer in the conductive region A refers to a percentage of an area occupied by the first conductive mesh layer in the conductive region A to a total area of the conductive region A. The mesh line depth-to-width ratio is a ratio of a mesh line width to a mesh line depth (namely, a height or a thickness). When the conductive region A and the conductive region B each use a conductive mesh structure, to facilitate manufacturing, the materials of the transparent colloidal layers or the transparent conductive oxide layers of the two regions may be completely the same.

To make the conductivity of the conductive region B higher than the conductivity of the conductive region A, a conductive modification layer may be disposed on the second conductive mesh layer in the conductive region B. In some implementations of this application, the conductive region B further includes a conductive modification layer disposed on the second conductive mesh layer. A material of the conductive modification layer includes but is not limited to one of or a combination of more of a metal or an alloy and a metal nanowire. The metal or alloy may include one or more of gold, silver, nickel, copper, aluminum, or the like.

In an implementation of this application, when the front electrode includes a transparent colloidal layer, to be specific, when a conductive mesh layer is embedded in the transparent colloidal layer, the front electrode further includes a planar conductive layer or a conductive adhesive layer disposed between the transparent colloidal layer and the functional layer, and the conductive mesh layer in the front electrode is electrically connected to the functional layer through the planar conductive layer or the conductive adhesive layer. The planar conductive layer may completely cover only the conductive region A, or may completely cover the conductive region A and partially or completely cover the conductive region B. For the front electrode in which the conductive region A and the conductive region B each use a conductive mesh structure, usually, the planar conductive layer or the conductive adhesive layer completely covers the conductive region A and the conductive region B. Specifically, in some implementations, the conductive region A of the front electrode further includes a planar conductive layer or a conductive adhesive layer disposed on the transparent colloidal layer and the first conductive mesh layer, and the first conductive mesh layer is electrically connected to the functional layer through the planar conductive layer or the conductive adhesive layer. In some implementations, the conductive region B of the front electrode further includes a planar conductive layer or a conductive adhesive layer disposed on the transparent colloidal layer and the second conductive mesh layer, and the second conductive mesh layer is electrically connected to the functional layer through the planar conductive layer or the conductive adhesive layer. Because a contact area between the conductive mesh layer and the functional layer is limited, photocurrent extraction is limited. An area of a conductive surface that is of the electrode and that contacts the functional layer can be enlarged by disposing the planar conductive layer on the conductive mesh layer. In an implementation of this application, a material of the planar conductive layer includes but is not limited to any one of or a combination of more of a transparent conductive oxide, a metal nanowire, a carbon nanotube, graphene, and a conductive polymer. Optionally, when the transparent conductive oxide is used as the planar conductive layer, the planar conductive layer can better match the functional layer in material energy level, thereby facilitating performance improvement of the cell. Similarly, the conductive adhesive layer can also enlarge the area of the conductive surface that is of the electrode and that contacts the functional layer. In addition, when the front electrode and the functional layer are combined by using the conductive adhesive layer, the front electrode can be additionally manufactured, to be specific, the front electrode is manufactured independent of the back electrode and the functional layer, and then the front electrode and the functional layer are combined. Therefore, the functional layer can be prevented from being damaged by a manufacturing process of the front electrode, and the functional layer can be effectively protected. The conductive adhesive layer includes a conductive and adhesive material. A specific material is not limited. Optionally, the conductive adhesive layer may include a conductive adhesive. Specifically, for example, the conductive adhesive layer may include PEDOT:PSS doped with D-sorbitol, where PEDOT is a polymer of EDOT (3,4-ethylenedioxythiophene), and PSS is sodium polystyrene sulfonate.

In an implementation of this application, when the front electrode includes a transparent conductive oxide layer, to be specific, when a conductive mesh layer is embedded in the transparent conductive oxide layer, the transparent conductive oxide layer and the functional layer may be disposed to be in contact and stacked, that is, the functional layer is directly deposited on the transparent conductive oxide layer; or the front electrode further includes a conductive adhesive layer disposed between the transparent conductive oxide layer and the functional layer, and the conductive mesh layer in the front electrode is electrically connected to the functional layer through the conductive adhesive layer. When the front electrode and the functional layer are combined by using the conductive adhesive layer, the front electrode can be additionally manufactured, to be specific, the front electrode is manufactured independent of the back electrode and the functional layer, and then the front electrode and the functional layer are combined. Therefore, the functional layer can be prevented from being damaged by a manufacturing process of the front electrode, and the functional layer can be effectively protected. A specific material of the conductive adhesive layer is not limited, for example, may be PEDOT:PSS doped with D-sorbitol.

It should be noted that when the conductive region B further includes the conductive modification layer disposed on the second conductive mesh layer, the conductive modification layer may be located between the second conductive mesh layer and the planar conductive layer or between the second conductive mesh layer and the conductive adhesive layer.

In an implementation of this application, the conductive region C includes a metal layer or an alloy layer. The metal or alloy layer may include one or more of gold, silver, nickel, copper, aluminum, or the like. The metal or alloy layer may be of a single-layer structure including one metal or alloy, or may be of a multi-layer structure including a plurality of different metals or alloys. When the metal or alloy layer of the conductive region C is a thin layer (whose thickness may be 4 nm to 25 nm), the conductive region C may present a transparent or semi-transparent effect. If the conductive region C needs to be opaque, the metal or alloy layer may not be designed as a thin layer.

In another implementation of this application, the conductive region C includes a first layer and a second layer that are stacked, where the first layer includes a metal layer or an alloy layer, and the second layer includes a transparent conductive oxide layer or a metal oxide layer. The second layer is located on a side that is of the first layer and that is away from the functional layer, that is, the first layer is relatively close to the functional layer, and the second layer is relatively away from the functional layer. In an implementation of this application, the metal or alloy layer is a thin metal or alloy layer (whose thickness may be 4 nm to 25 nm), and the metal oxide layer includes one or more of molybdenum oxide, zinc oxide, or tungsten oxide.

In another implementation of this application, the conductive region C includes a first layer and a second layer that are stacked, where the first layer is a barrier layer, the barrier layer includes an organic barrier material and/or an inorganic barrier material, and the second layer is a transparent conductive oxide layer. The second layer is located on a side that is of the first layer and that is away from the functional layer, that is, the first layer is relatively close to the functional layer, and the second layer is relatively away from the functional layer. The organic barrier material includes but is not limited to copper phthalocyanine (CuPc), bathocuproine (BCP), and zinc phthalocyanine (ZnPc). The inorganic barrier material includes but is not limited to lithium metal (Li) and lithium fluoride.

In still another implementation of this application, the conductive region C includes a transparent conductive oxide layer and a third conductive mesh layer embedded in the transparent conductive oxide layer, or includes a transparent colloidal layer and a third conductive mesh layer embedded in the transparent colloidal layer, where the third conductive mesh layer is electrically connected to the functional layer. Materials of the transparent colloidal layer and the transparent conductive oxide layer are specifically as described above.

In an implementation of this application, the conductive region D may be transparent, semi-transparent, or opaque. For example, for a pair of smart glasses, generally, there is an attachment region between a lens and a groove in a glasses frame. The attachment region is opaque in a visual effect. It is assumed that an attachment region of 3 $cm^2$ to 5 $cm^2$ has a light irradiation power of 300 mW to 500 mW under standard illuminance. For example, if a single semi-transparent thin-film solar cell design is used for the entire lens (that is, all regions are semi-transparent), a large amount of light loss is caused in this region. In this embodiment of this application, transparency of the conductive region D is minimized or even designed to be opaque, so that a light loss can be reduced, and comprehensive photoelectric conversion efficiency of a large-area thin-film solar cell can be improved, thereby maximizing photoelectric conversion efficiency based on a form feature of a product or an application scenario. Specifically, in an implementation, if the conductive region D is opaque and the conductive region C is semi-transparent, a thin-film solar cell with mixed transparency can be formed. A battery device with a semi-transparent region and an opaque region can improve comprehensive photoelectric conversion efficiency compared with a single semi-transparent battery device with a same area.

In an implementation of this application, the conductive region D includes a transparent conductive oxide layer and a fourth conductive mesh layer embedded in the transparent conductive oxide layer, or includes a transparent colloidal layer and a fourth conductive mesh layer embedded in the transparent colloidal layer, where the fourth conductive mesh layer is electrically connected to the functional layer.

In another implementation of this application, the conductive region D includes one or more of a metal layer or an alloy layer, a metal nanowire, graphene, a carbon nanotube, and a conductive polymer. The metal or alloy layer may include one or more of gold, silver, nickel, copper, aluminum, or the like. The metal or alloy layer may be of a single-layer structure including one metal or alloy, or may be of a multi-layer structure including a plurality of different metals or alloys.

In some implementations of this application, the conductive region C and the conductive region D each use a conductive mesh structure. In this implementation, to make the conductivity of the conductive region D higher than the conductivity of the conductive region C, a conductivity difference may be implemented by designing the third conductive mesh layer and the fourth conductive mesh layer differently, and a specific design manner is not limited. For details, refer to the designs of the first conductive mesh layer and the second conductive mesh layer of the front electrode. For example, in some implementations of this application, area coverage of the fourth conductive mesh layer in the conductive region D is greater than area coverage of the third conductive mesh layer in the conductive region C. In some other implementations of this application, a mesh line depth-to-width ratio of the fourth conductive mesh layer is greater than a mesh line depth-to-width ratio of the third conductive mesh layer. The area coverage of the third conductive mesh layer in the conductive region C refers to a percentage of an area occupied by the third conductive mesh layer in the conductive region C to a total area of the conductive region C. Similarly, the area coverage of the fourth conductive mesh layer in the conductive region D refers to a percentage of an area occupied by the fourth conductive mesh layer in the conductive region D to a total area of the conductive region D. The mesh line depth-to-width ratio is a ratio of a mesh line width to a mesh line depth (namely, a height or a thickness). In some other implementations of this application, a conductive modification layer may be further disposed on the fourth conductive mesh layer in the conductive region D. That is, the conductive region D further includes the conductive modification layer disposed on the fourth conductive mesh layer. A material of the conductive modification layer includes but is not limited to one of or a combination of more of a metal layer or an alloy layer and a metal nanowire. The metal or alloy may include one or more of gold, silver, nickel, copper, aluminum, or the like.

In an implementation of this application, when the back electrode includes a conductive mesh layer, the back electrode further includes a planar conductive layer or a conductive adhesive layer, and the conductive mesh layer in the back electrode is electrically connected to the functional layer through the planar conductive layer or the conductive adhesive layer.

In some implementations of this application, when the back electrode includes a transparent colloidal layer, to be specific, when a conductive mesh layer is embedded in the transparent colloidal layer, the back electrode further includes a planar conductive layer or a conductive adhesive layer disposed between the transparent colloidal layer and the functional layer, and the conductive mesh layer in the back electrode is electrically connected to the functional layer through the planar conductive layer or the conductive adhesive layer. The planar conductive layer may completely cover only the conductive region C, may completely cover only the conductive region D, or may cover both the conductive region C and the conductive region D. For the back electrode in which the conductive region C and the conductive region D each use a conductive mesh structure, usually, the planar conductive layer or the conductive adhesive layer completely covers the conductive region C and the conductive region D. Specifically, in some implementations, the conductive region C of the back electrode further includes a planar conductive layer or a conductive adhesive layer disposed on the transparent colloidal layer and the third conductive mesh layer, and the third conductive mesh layer is electrically connected to the functional layer through the planar conductive layer or the conductive adhesive layer. In some implementations, the conductive region D of the back electrode further includes a planar conductive layer or a conductive adhesive layer disposed on the transparent colloidal layer and the fourth conductive mesh layer, and the fourth conductive mesh layer is electrically connected to the functional layer through the planar conductive layer or the conductive adhesive layer. The planar conductive layer can be disposed to enlarge an area of a conductive surface that is of the electrode and that contacts the functional layer. A material of the planar conductive layer includes but is not limited to any one of or a combination of more of a transparent conductive oxide, a metal nanowire, a carbon nanotube, graphene, and a conductive polymer. Optionally, when the transparent conductive oxide is used as the planar conductive layer, the planar conductive layer can better match the functional layer in material energy level, thereby facilitating performance improvement of the cell. Similarly, the conductive adhesive layer can also enlarge the area of the conductive surface that is of the electrode and that contacts the functional layer. In addition, when the back electrode and the functional layer are combined by using the conductive adhesive layer, the back electrode can be additionally manufactured, to be specific, the back electrode is manufactured independent of the front electrode and the functional layer, and then the back electrode and the functional layer are combined. Therefore, the functional layer can be prevented from being damaged by a manufacturing process of the back electrode, and the functional layer can be effectively protected. The conductive adhesive layer is specifically as described above.

In some other implementations of this application, when the back electrode includes a transparent conductive oxide layer, to be specific, when a conductive mesh layer is embedded in the transparent conductive oxide layer, the transparent conductive oxide layer and the functional layer may be disposed to be in contact and stacked, that is, the functional layer is directly deposited on the transparent conductive oxide layer; or the back electrode further includes a conductive adhesive layer disposed between the transparent conductive oxide layer and the functional layer, and the conductive mesh layer in the back electrode is electrically connected to the functional layer through the conductive adhesive layer. When the back electrode and the functional layer are combined by using the conductive adhesive layer, the back electrode can be additionally manufactured, to be specific, the back electrode is manufactured independent of the front electrode and the functional layer, and then the back electrode and the functional layer are combined. Therefore, the functional layer can be prevented from being damaged by a manufacturing process of the back electrode, and the functional layer can be effectively protected. A specific material of the conductive adhesive layer is not limited, for example, may be PEDOT:PSS doped with D-sorbitol.

It should be noted that when the conductive region D further includes the conductive modification layer disposed on the fourth conductive mesh layer, the conductive modification layer may be located between the fourth conductive mesh layer and the planar conductive layer or between the fourth conductive mesh layer and the conductive adhesive layer.

In an implementation of this application, when the front electrode and the back electrode each include a conductive mesh layer structure, because a manufacturing process of the conductive mesh layer structure generally includes an imprinting operation, the functional layer may be adversely affected if an electrode is directly manufactured on the functional layer. Therefore, to protect the functional layer, in a solar cell manufacturing process, when one of the front electrode and the back electrode is combined with the functional layer, that is, when the functional layer is manufactured on one electrode, the other electrode may be additionally manufactured, and may be combined with the functional layer by using a conductive adhesive layer, instead of being directly manufactured on the functional layer. This can prevent the functional layer from being damaged by directly manufacturing the other electrode on the functional layer. To be specific, in some implementations of this application, when the current electrode and the back electrode each include a conductive mesh layer, the conductive mesh layer of at least one of the front electrode or the back electrode is combined with the functional layer by using the conductive adhesive layer, to implement an electrical connection. Specifically, the conductive mesh layer of the front electrode or the conductive mesh layer of the back electrode is combined with the functional layer by using the conductive adhesive layer. For example, the conductive mesh layer of the front electrode is combined with the functional layer by using the conductive adhesive layer, and the conductive mesh layer of the back electrode is combined with the functional layer by using the planar conductive layer (the conductive mesh layer of the back electrode may be embedded in the transparent colloidal layer) or is directly in contact with, stacked with, and combined with the functional layer (the conductive mesh layer of the back electrode may be embedded in the transparent conductive oxide layer). For another example, the conductive mesh layer of the back electrode is combined with the functional layer by using the conductive adhesive layer, and the conductive mesh layer of the front electrode is combined with the functional layer by using the planar conductive layer or is directly in contact with, stacked with, and combined with the functional layer. Specifically, whether the conductive mesh layer in the front electrode or the conductive mesh layer in the back electrode uses the conductive adhesive layer to combine with the functional layer may be determined based on an actual manufacturing sequence of the two electrodes.

In an implementation of this application, a material of the conductive mesh layer is a material having good conductive performance. Optionally, a conductive mesh material of each of the first conductive mesh layer, the second conductive mesh layer, the third conductive mesh layer, and the fourth conductive mesh layer may include one of or a combination of more of a metal layer or an alloy layer, a conductive polymer, a carbon nanotube, graphene, and a metal nanowire. The metal or alloy may include one or more of gold, silver, nickel, copper, aluminum, or the like. When the metal or alloy layer is included, the metal or alloy layer may be a single-layer structure including one metal or alloy, or may be a multi-layer structure including a plurality of different metals or alloys. For example, the conductive mesh layer includes a silver layer and a copper layer that are stacked, that is, the conductive mesh layer is of a double-layer structure including silver and copper.

In an implementation of this application, the functional layer includes a light absorption layer and a first carrier transport layer and a second carrier transport layer that are respectively stacked on two opposite sides of the light absorption layer.

In some implementations of this application, the solar cell further includes a substrate, where the front electrode, the functional layer, and the back electrode are disposed on the substrate. The substrate may be located on a side that is of the front electrode and that is away from the functional layer, or may be located on a side that is of the back electrode and that is away from the functional layer. A material of the substrate may be a conventional solar cell substrate material, for example, may be polyethylene terephthalate (PET).

In an implementation of this application, a front electrode extraction region is disposed in the conductive region B, and a back electrode extraction region is disposed in the conductive region D. The front electrode and the back electrode may be extracted in a manner, for example, as conducting wires, in the extraction regions to serve as positive and negative electrodes of the solar cell for external supply power.

The solar cell in this embodiment of this application has both a large area size and high photoelectric conversion efficiency. The solar cell can be used in a scenario, for example, a lens, a display, or a transparent housing of a wearable smart device, for example, a pair of smart glasses, a pair of smart goggles, an AR (Augmented Reality) device, a VR (Virtual Reality) device, an AR/VR device, a smart watch or wristband, or a headset, or a display, a transparent housing, or the like of a smart consumer electronics device, for example, a mobile phone, a tablet computer, or a notebook computer, or can be used in another scenario, for example, a vehicle, a building, or Internet of Things.

According to a second aspect, an embodiment of this application further provides an electronic device. The electronic device includes the solar cell according to the first aspect of this application, where the solar cell is configured to supply power to the electronic device. The electronic device may be a wearable smart device, for example, a pair of smart glasses, a pair of smart goggles, an AR device, a VR device, an AR/VR device, a smart watch or wristband, or a headset; may be a smart consumer electronics device, for example, a mobile phone, a tablet computer, or a notebook computer; may be a mobile vehicle, for example, a car; or the like. A disposition position of the solar cell in the electronic device may be designed based on a requirement. The solar cell may be a lens, a display, or a transparent housing used for a wearable smart device, or may be a display, a transparent housing, or the like used for a smart consumer electronics device. The electronic device in this embodiment of this application uses the solar cell described in this embodiment of this application to improve a product battery life and improve product competitiveness.

In an implementation of this application, the solar cell is electrically connected to a power consumption module in the electronic device through the conductive region B and the conductive region D.

In an implementation, the electronic device is a pair of smart glasses. The pair of smart glasses includes a power consumption module and the solar cell, where the solar cell may supply power to the power consumption module. In an implementation, the solar cell is integrated with a lens to form a solar cell lens, and the solar cell lens includes a lens substrate and the solar cell disposed on the lens substrate. When the solar cell in this application is used for power supply, because the solar cell has both a large area size and high efficiency, a battery life can be greatly prolonged. This facilitates integration of richer functions such as man-machine interaction or health monitoring, relieves an urgent requirement of complex function integration for a large-capacity, high-energy-density cell, and resolves a contradiction problem between power consumption and the battery life. The lens substrate may be a transparent substrate.

In an implementation, the pair of smart glasses further includes glasses temples, where the glasses temple is integrated with a power consumption module, and the power consumption module includes functional modules such as a battery, a processor, a sensor, and a communication module.

DESCRIPTION OF EMBODIMENTS

The following describes embodiments of this application with reference to the accompanying drawings in embodiments of this application.

Figure 1:
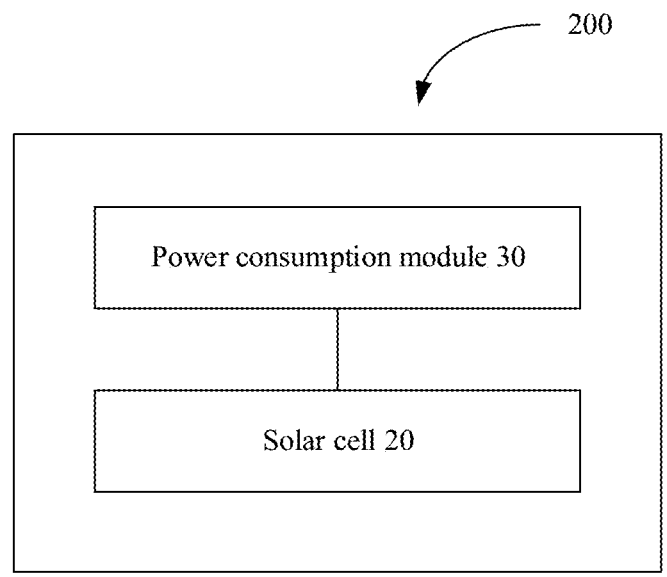
FIG. 1 is a schematic diagram of a structure of an electronic device 200 according to an embodiment of this application.

Refer to FIG. 1. An embodiment of this application provides an electronic device 200, including a solar cell 20. The solar cell 20 is electrically connected to a power consumption module 30 in the electronic device, and may be configured to supply power to the power consumption module 30. The electronic device 200 may be a wearable smart device, for example, a pair of smart glasses, a pair of smart goggles, an AR device, a VR device, an AR/VR device, a smart watch or wristband, or a headset; may be a smart consumer electronics device, for example, a mobile phone, a tablet computer, or a notebook computer: or may be a mobile vehicle, for example, a car. The solar cell may be specifically a lens, a display, a transparent housing, or the like used for an electronic device. For example, the solar cell may be a lens, a display, or a transparent housing used for a wearable smart device, or may be a display, a transparent housing, or the like used for a smart consumer electronics device. The power consumption module 30 may include power consumption modules such as a battery, a processor, a sensor, and a communication module.

Figure 2A:
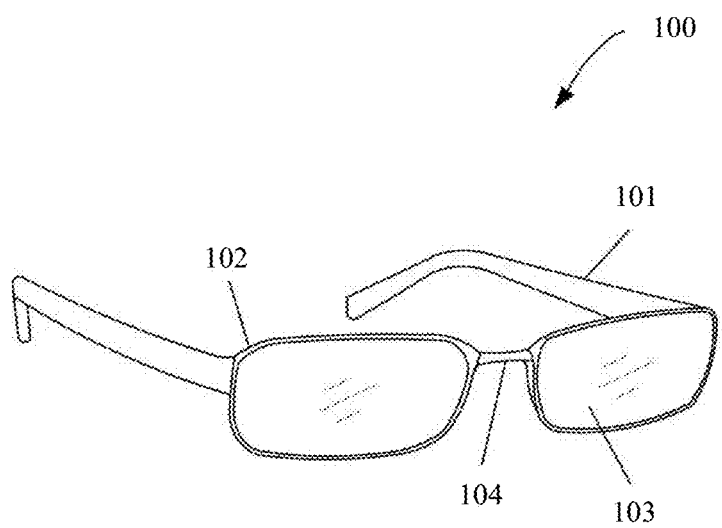
FIG. 2a is a schematic diagram of a structure of a pair of smart glasses 100 according to an embodiment of this application.
Figure 2B:
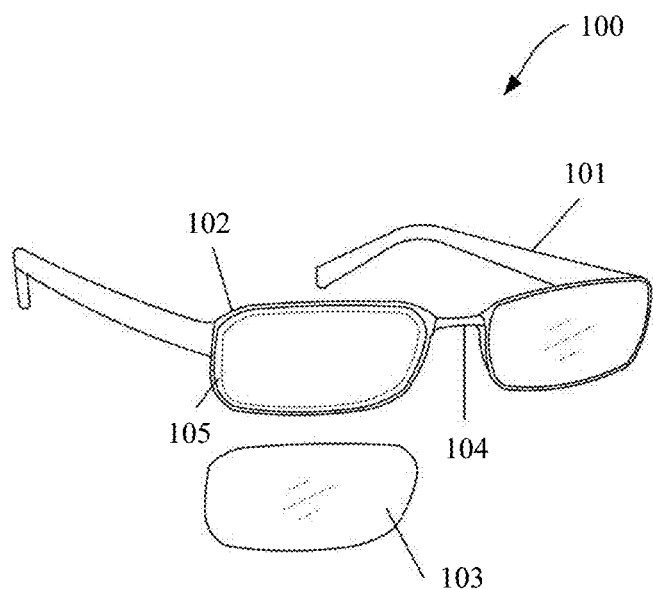
FIG. 2b is a schematic diagram of a structure of a locally separated part of the pair of smart glasses 100 according to an embodiment of this application.
Figure 3:
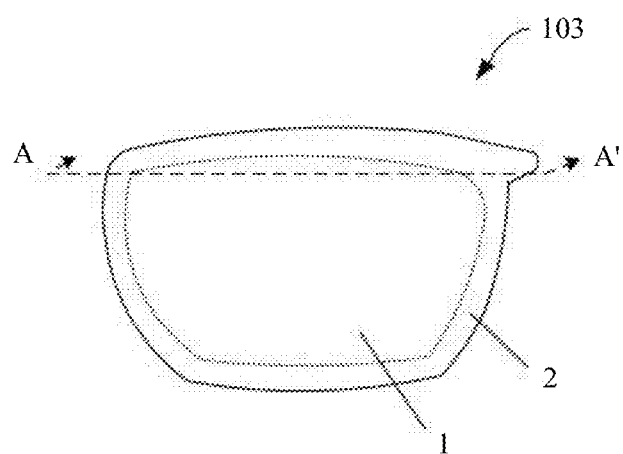
FIG. 3 is a schematic diagram of a structure of a solar cell lens 103 according to an embodiment of this application.

Refer to FIG. 2a, FIG. 2b, and FIG. 3. FIG. 2a is a schematic diagram of a structure of a pair of smart glasses 100 according to an embodiment of this application. FIG. 2b is a schematic diagram of a structure of a locally separated part of the pair of smart glasses 100 according to an embodiment of this application. FIG. 3 is a schematic diagram of a structure of a solar cell lens 103. The pair of smart glasses 100 includes glasses temples 101, glasses frames 102, solar cell lenses 103, and a cross beam 104, where the solar cell lens 103 is integrated with a solar cell. In an example, the solar cell lens 103 is embedded in a groove 105 of the glasses frame 102. A region covered by the groove 105 is visually opaque, and is defined as an external region 2 of the solar cell lens 103. A region not covered by the groove 105 is defined as an internal region 1 of the solar cell lens 103. For ease of understanding, in FIG. 3, a boundary between the external region 2 and the internal region 1 is distinguished by using a closed dashed dividing line. It should be understood that the dividing line is merely a schematic identification line, and the dividing line is not marked in an actual product. In an implementation of this application, various power consumption modules 30 such as a battery, a processor, a sensor, and a communication module may be integrated in the glasses temple 101 or the glasses frame 102 based on a requirement. The solar cell integrated in the solar cell lens 103 is electrically connected to the power consumption modules 30 in the glasses temple 101 or the glasses frame 102 to supply power to the power consumption modules. In some implementations, the power consumption modules 30 are integrated in the glasses temple 101, and the solar cell is electrically connected to the power consumption modules 30 in the glasses temple 101, so that the solar cell supplies power to the power consumption modules 30 in the glasses temple 101. The solar cell may be electrically connected to the power consumption modules 30 in the glasses temple 101 through a hinge. However, this is not limited thereto. In some implementations, the glasses temple 101 may be folded, and states of the glasses temple 101 include an unfolded state and a folded state. In some implementations, the power consumption modules 30 are integrated in the glasses frame 102, and the solar cell is electrically connected to the power consumption modules 30 in the glasses frame 102, so that the solar cell supplies power to the power consumption modules 30 in the glasses frame 102. The sensor may be an azimuth sensor, a GPS (Global Positioning System) sensor, a temperature sensor, a touch sensor, an infrared sensor, or the like.

It should be noted that the pair of smart glasses 100 of the structures shown in FIG. 2a and FIG. 2b is merely a structure in an implementation of this application. The structure of the pair of smart glasses 100 in this application is not limited to the structures shown in FIG. 2a and FIG. 2b. In this application, a structure of the glasses temple 101, a structure of the glasses frame 102, a fastening manner of the solar cell lens 103, and the like may be implemented in a plurality of forms. For example, the glasses frame 102 may be disposed around the entire solar cell lens 103 as shown in FIG. 2a, namely, a full-frame structure. Alternatively, the glasses frame 102 may be disposed around only a part of a periphery of the solar cell lens 103, to be specific, only a part of the solar cell lens 103 is fixedly connected to the glasses frame 102, for example, a half-frame structure. Alternatively, in some embodiments, the pair of smart glasses 100 may not be provided with a glasses frame 102, that is, has a frame-free structure.

Figure 4A:
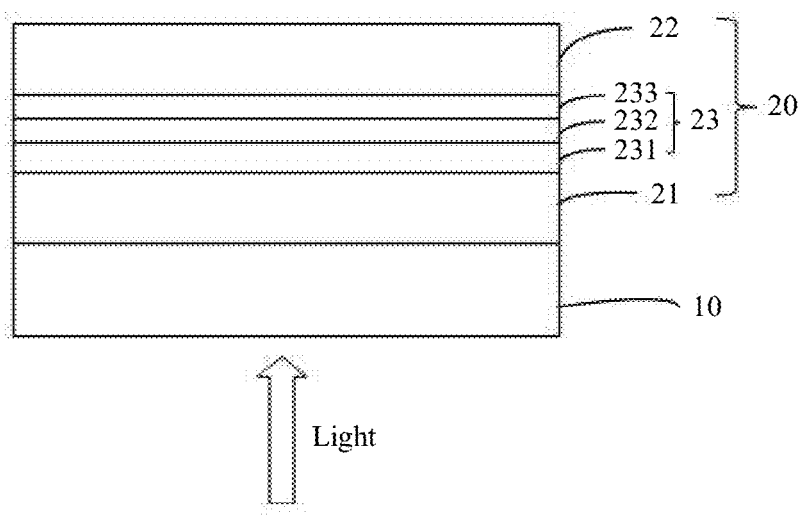
FIG. 4a and FIG. 4b are schematic diagrams of structures of cross-sections obtained through cutting the solar cell lens shown in FIG. 3 along a position AA.
Figure 4B:
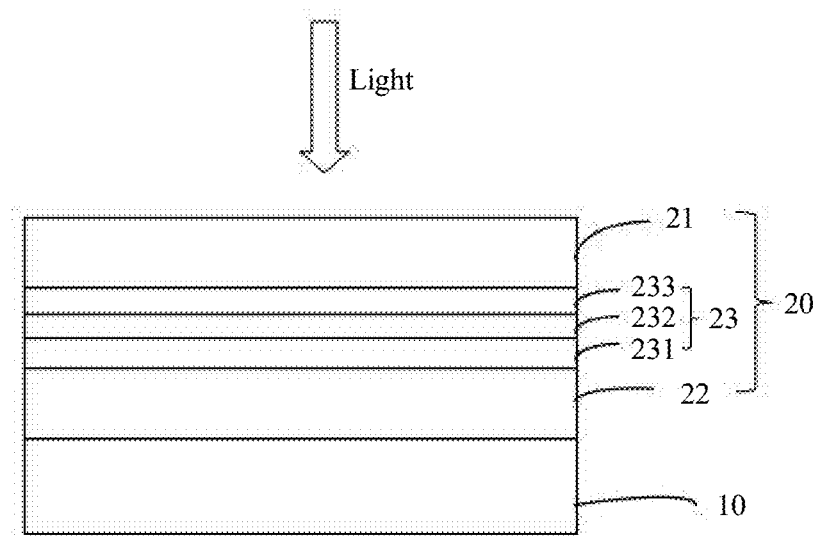

Refer to FIG. 4a and FIG. 4b. FIG. 4a and FIG. 4b are schematic diagrams of cross-sectional structures obtained through cutting the solar cell lens 103 shown in FIG. 3 along a position AA'. The solar cell lens 103 includes a lens substrate 10 and a solar cell 20 disposed on the lens substrate 10. The lens substrate 10 is a transparent substrate, and a material of the lens substrate 10 may be, for example, resin or glass. The solar cell 20 may be formed directly on the lens substrate 10 by using the lens substrate 10 as a substrate, or may be integrally bonded to the lens substrate 10 after being manufactured on another substrate, that is, in some implementations, the solar cell 20 may further include the another substrate. The another substrate may be specifically a commonly used solar cell substrate, for example, polyethylene terephthalate (PET). The solar cell 20 includes a front electrode 21, a back electrode 22, and a functional layer 23 stacked between the front electrode 21 and the back electrode 22, where the functional layer 23 includes a first carrier transport layer 231, a light absorption layer 232, and a second carrier transport layer 233 that are successively stacked, a material of the light absorption layer 232 absorbs photons and then is excited to generate electron-hole pairs, and the first carrier transport layer 231 and the second carrier transport layer 233 separately extract electrons or holes and transmit the electrons or holes to the front electrode 21 and the back electrode 22 for external power supply. The front electrode 21 is an electrode on a side of an illuminated surface, and incident light is incident on the light absorption layer 232 from the front electrode 21. The back electrode 22 is an electrode on a side of a shady surface. The lens substrate 10 may be disposed on a side of the front electrode 21 (as shown in FIG. 4a), or may be disposed on a side of the back electrode 22 (as shown in FIG. 4b).

Figure 5A:
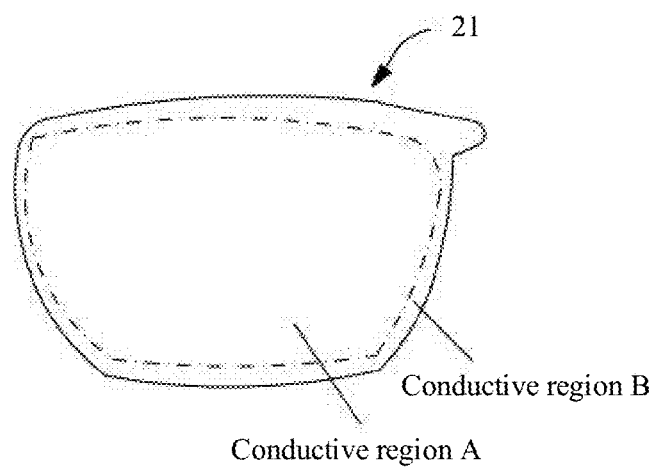
FIG. 5a and FIG. 5b are regional schematic diagrams of a front electrode 21 and a back electrode 22 of a solar cell 20 respectively according to an embodiment of this application.
Figure 5B:
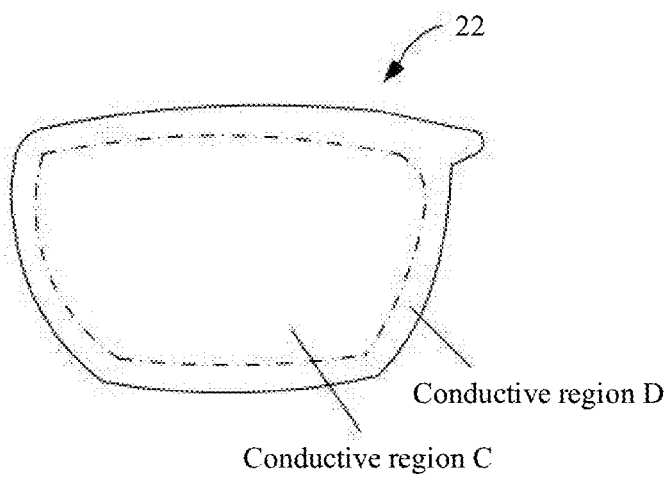
Figure 6:
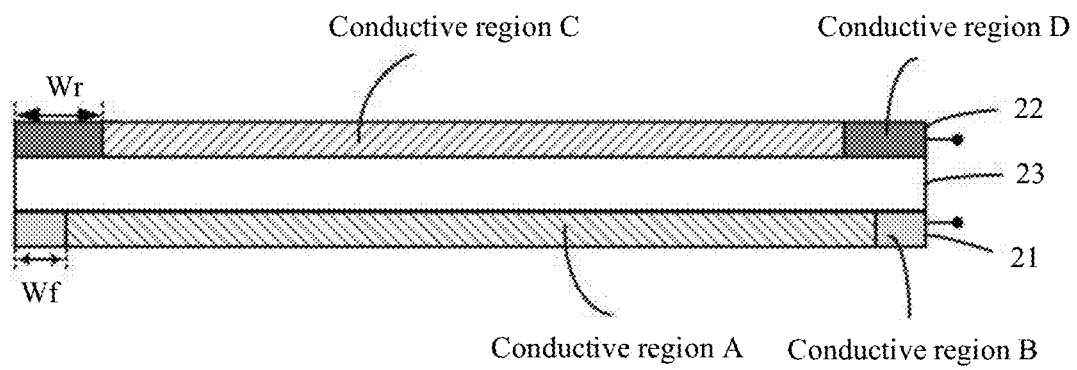
FIG. 6 and FIG. 7 are schematic diagrams of cross-sectional structures of a solar cell 20 according to an implementation of this application.

Refer to FIG. 5a, FIG. 5b, and FIG. 6. In an implementation of this application, the front electrode 21 of the solar cell 20 includes a low-conductivity region (namely, a conductive region A) and a high-conductivity region (namely, a conductive region B) disposed around the conductive region A. The back electrode 22 includes a low-conductivity region (namely, a conductive region C) and a high-conductivity region (namely, a conductive region D) disposed around the conductive region C. Conductivity of the conductive region B is higher than conductivity of the conductive region A, and/or conductivity of the conductive region D is higher than conductivity of the conductive region C. The front electrode and/or the back electrode may be designed to be separated by region and to include an internal conductive region and an external conductive region, and conductivity of the external conductive region is designed to be higher than conductivity of the internal conductive region. This can implement effective uniform convergence of a photocurrent of a front electrode and a back electrode in a large-area thin-film solar cell, avoid large-scale non-uniform lateral convergence of the photocurrent along surfaces of the front electrode and the back electrode, reduce a film loss and high dependence on film rectangular resistances of the front electrode and the back electrode, and improve photoelectric conversion efficiency of the cell. In addition, the design by region can improve cell comprehensive performance by flexibly selecting materials based on different requirements of different regions for performance, for example, transparency, in different application scenarios.

In an implementation of this application, the conductive region B is disposed around the conductive region A, and is in close contact with and electrically connected to the conductive region A. The conductive region B is configured to converge a photocurrent of the conductive region A. The conductive region B may completely surround the conductive region A as shown in FIG. 5a, or may partially surround the conductive region A. A size of the conductive region A is greater than the conductive region B. The conductive region D is disposed around the conductive region C, and is in close contact with and electrically connected to the conductive region C. The conductive region D is configured to converge a photocurrent of the conductive region C. The conductive region D may completely surround the conductive region C as shown in FIG. 5b, or may partially surround the conductive region C. A size of the conductive region C is greater than the conductive region D. The conductive region B completely surrounds the conductive region A, and the conductive region D completely surrounds the conductive region C. This can better implement uniform lateral transfer of the photocurrent.

In an implementation of this application, a degree of a conductivity difference between the conductive region B and the conductive region A is not limited, a degree of a conductivity difference between the conductive region D and the conductive region C is not limited, and the two degrees may be set based on an actual requirement. A larger degree of the conductivity difference is more conducive to convergence of photoelectrons. In some implementations, the conductivity of the conductive region B may be several to hundreds times higher than the conductivity of the conductive region A, for example, five times to 200 times. The conductivity of the conductive region D may be several to hundreds times higher than the conductivity of the conductive region C, for example, five times to 200 times. In some implementations, conductivity of each conductive region may be evaluated by using a film rectangular resistance of the conductive region. The film rectangular resistance is film rectangular resistance, and a unit is $\Omega/\square$. A higher film rectangular resistance of a conductive region indicates lower conductivity of the conductive region. Therefore, when a film rectangular resistance of the conductive region B is less than a film rectangular resistance of the conductive region A, the conductivity of the conductive region B is higher than the conductivity of the conductive region A. When a film rectangular resistance of the conductive region D is less than a film rectangular resistance of the conductive region C, the conductivity of the conductive region D is higher than the conductivity of the conductive region C. In some implementations, the film rectangular resistance of the conductive region A may be several to hundreds times higher than the film rectangular resistance of the conductive region B, for example, five times to 200 times. In some implementations, the film rectangular resistance of the conductive region C may be several to hundreds times higher than the film rectangular resistance of the conductive region D, for example, five times to 200 times. In some implementations, the film rectangular resistance of the conductive region A may be $0.05\Omega/\square$ to $20\Omega/\square$; and the film rectangular resistance of the conductive region C may be $0.05\Omega/\square$ to $20\Omega/\square$. In some implementations, the film rectangular resistance of the conductive region A may be $1\Omega/\square$ to $10\Omega/\square$; and the film rectangular resistance of the conductive region C may be $1\Omega/\square$ to $10\Omega/\square$. The foregoing multiple range of five times to 200 times may be specifically, for example, five times, 10 times, 20 times, 50 times, 100 times, 150 times, or 200 times. A high-conductivity region is disposed around the cell to uniformly converge a photocurrent of an internal conductive region. This can effectively reduce a loss caused by large-scale non-uniform transfer of charges in a large-area thin-film solar cell, and improve photoelectric conversion efficiency of the cell.

In an implementation of this application, a material, a thickness, a region size, and the like of the conductive region B located at an external part in the front electrode 21 and a material, a thickness, a region size, and the like of the conductive region D located at an external part in the back electrode 22 may be set based on an actual application requirement. In the pair of smart glasses, usually, to enlarge a light transmission surface of the solar cell lens 103 as a whole, a width $W_f$ (as shown in FIG. 6) of the conductive region B should be set as small as possible, for example, the width of the conductive region B may be less than or equal to 1 mm. When the front electrode is used as a side of the illuminated surface, the width of the external high-conductivity region B is as narrow as possible, thereby reducing an incident light loss of the solar cell. In an implementation of this application, a width $W_r$ (as shown in FIG. 6) of the conductive region D may be determined based on a width of the groove in the glasses frame, to be specific, the conductive region D may be disposed completely or not completely corresponding to the external region 2 of the pair of smart glasses 100. Complete corresponding is that the conductive region D is completely the same as the visually opaque external region 2 (namely, the groove region of the glasses frame) of the pair of smart glasses 100 in region shape and size, and projections of the two regions on a horizontal plane of the lens completely coincide, that is, the width of the conductive region D is equal to the width of the groove in the glasses frame. An enough high-conductivity region area can be ensured as far as possible by implementing complete corresponding, to improve cell efficiency. In some implementations, the width of the conductive region D may be less than or equal to 1 mm. The conductive region B may be completely the same as or different from the conductive region D in region size and shape. Widths at different positions of the conductive region B and the conductive region D may be the same or different.

Visible light transmittance (VLT) of the solar cell 20 may be adjusted based on materials, thicknesses, and the like of the functional layer and the back electrode. In an implementation of this application, VLT of the internal region of the solar cell may be $\eta\%$, where $0<\eta\leq100$, and $\eta$ may be adjusted based on materials and thicknesses of the back electrode and the functional layer in the internal region; and VLT of the external region of the solar cell may be $\gamma\%$, where $\gamma$ may be adjusted based on materials and thicknesses of the back electrode and the functional layer in the external region, and a value of $\gamma$ may meet $0\leq\gamma<\eta$.

In some implementations, in the solar cell, based on a material difference and a thickness difference between the back electrode in the internal region and the back electrode in the external high-conductivity region, a material difference and a thickness difference between functional layers in corresponding coverage regions, or the like, a transparency difference between the internal region and the external region of the solar cell can be implemented, so that a thin-film solar cell with mixed transparency is obtained, and maximization of light capture can be implemented by effectively using a scenario form feature.

In an implementation of this application, the conductive region A may be transparent, and the conductive region C may be transparent or semi-transparent. The conductive region B may be transparent, semi-transparent, or opaque. The conductive region D may be transparent, semi-transparent, or opaque.

In a manufacturing process of the solar cell 20, the front electrode 21 and the back electrode 22 may be combined with the functional layer 23 in a plurality of forms. Specifically, when the front electrode 21 and the back electrode 22 each include a conductive mesh layer structure, because a manufacturing process of the conductive mesh layer structure generally includes an imprinting operation, the functional layer may be adversely affected if an electrode is directly manufactured on the functional layer 23. Therefore, to protect the functional layer 23, usually, a conductive mesh layer in an electrode that is first combined with the functional layer 23 is combined with the functional layer by using a planar conductive layer, and a conductive mesh layer in an electrode that is then combined with the functional layer is combined with the functional layer by using a conductive adhesive layer. For ease of description, the following performs description with an example in which the front electrode 21 is combined with the functional layer 23 first, and then the back electrode 22 is combined with the functional layer 23, that is, the front electrode 21, the functional layer 23, and the back electrode 22 are successively formed on the substrate.

Figure 7:
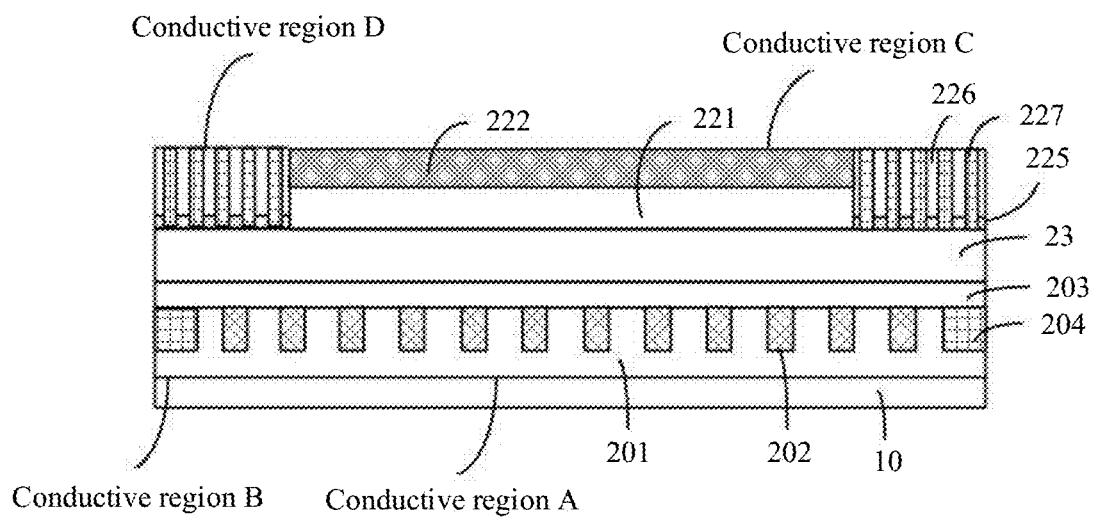
Figure 8:
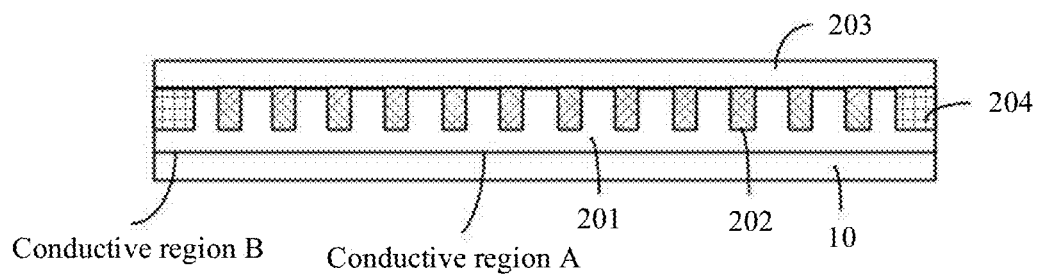
FIG. 8 is a schematic diagram of a cross-sectional structure of a front electrode 21 according to an implementation of this application.

Refer to FIG. 7 and FIG. 8. In an implementation of this application, the conductive region A of the front electrode 21 includes a transparent colloidal layer 201, a first conductive mesh layer 202 embedded in the transparent colloidal layer 201, and a planar conductive layer 203 disposed on the transparent colloidal layer 201 and the first conductive mesh layer 202. A thickness of the transparent colloidal layer 201 may be 2 μm to 20 μm, a depth of the first conductive mesh layer 202 may be 1 μm to 10 μm, and a thickness of the planar conductive layer 203 may be 5 nm to 100 nm. The conductive region A is an internal part of the solar cell 20, namely, an intermediate region. When a conductive mesh structure is used, this region can maintain high transparency while obtaining conductivity. There are a plurality of meshes in the conductive mesh structure, and these meshes do not shield light. This can reduce a light shielding area of an internal region of the pair of smart glasses 100 and increase a power generation amount per unit area of the solar cell. When the conductive meshes, transparent colloid, and the planar conductive layer are used to form the composite electrode, a film rectangular resistance loss can be reduced. This avoids a problem of a large film rectangular resistance loss caused by a transparent electrode that uses a TCO, a conductive polymer, or the like alone in a conventional solution.

A material of the transparent colloidal layer 201 may be a colloidal material formed through curing from a liquid state, and the material is transparent after being cured. The material includes but is not limited to a thermoplastic polymer, a photocurable polymer, and a thermosetting polymer. Specifically, the material is, for example, a UV curable adhesive. Connected mesh grooves are formed in the transparent colloidal layer 201, and a conductive mesh material is filled in the mesh grooves to form the first conductive mesh layer 202. The conductive mesh material of the first conductive mesh layer 202 may include one of or a combination of more of a metal layer or an alloy layer, a conductive polymer, a carbon nanotube, graphene, and a metal nanowire. Optionally, the conductive mesh material of the first conductive mesh layer 202 includes a metal layer or an alloy layer that has good conductivity. The conductive mesh material usually fills the mesh grooves exactly, that is, an upper surface of the first conductive mesh layer 202 (namely, a surface of a side close to the functional layer) is flush with an upper surface of the transparent colloidal layer (namely, a surface of a side close to the functional layer). In some implementations, the first conductive mesh layer 202 may be alternatively fully filled with the conductive mesh material based on a requirement, so that the conductive mesh material exceeds the first conductive mesh layer 202 by a specific height, to be specific, the upper surface of the first conductive mesh layer 202 is higher than the upper surface of the transparent colloidal layer. In some other implementations, the conductive mesh material may alternatively only partially fill the mesh grooves, to be specific, the upper surface of the first conductive mesh layer 202 is lower than the upper surface of the transparent colloidal layer. A graphical structure form of the conductive mesh is not limited, and may be a regular graphical structure, for example, a quadrangle, a pentagon, a hexagon, or another polygon, or may be an irregular graphical structure. The graphical structure form may be specifically set based on an actual requirement.

Because a contact area between the conductive mesh layer and the functional layer 23 is limited, electrical conduction of the electrode is limited. An area of a conductive surface that is of the electrode and that contacts the functional layer 23 of the cell can be enlarged by disposing the planar conductive layer 203 on the first conductive mesh layer 202. This improves performance of the cell. In an implementation of this application, a material of the planar conductive layer 203 includes but is not limited to any one of or a combination of more of a transparent conductive oxide, a metal nanowire, a carbon nanotube, graphene, and a conductive polymer. The transparent conductive oxide (TCO) is a thin film material with high transmittance and low resistivity in a visible light spectrum range (a wavelength is 380 nm to 780 nm). The TCO thin film material mainly includes indium tin oxide ITO, fluorine-doped tin oxide FTO, aluminum-doped zinc oxide AZO, gallium-doped zinc oxide GZO, boron-doped zinc oxide BZO, and the like.

Figure 9:
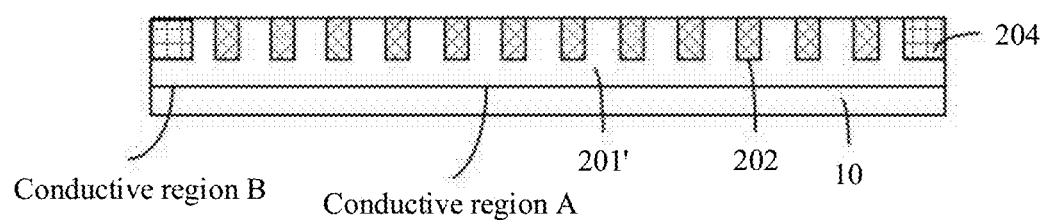
FIG. 9 is a schematic diagram of a cross-sectional structure of a front electrode 21 according to another implementation of this application.

Refer to FIG. 9. In another implementation of this application, the conductive region A of the front electrode 21 includes a transparent conductive oxide layer 201' and a first conductive mesh layer 202 embedded in the transparent conductive oxide layer 201'. A thickness of the transparent conductive oxide layer 201' may be 30 nm to 1000 nm. If the thickness of the transparent conductive oxide layer 201' is excessively large, transparency of the film layer decreases, and costs increase. In some implementations, one part of the first conductive mesh layer 202 may be embedded in PET or transparent colloid, and another part of the first conductive mesh layer 202 may be embedded in the transparent conductive oxide layer. That is, in some implementations, the conductive region A of the front electrode 21 includes a transparent colloidal layer and a transparent conductive oxide layer that are stacked, where the first conductive mesh layer 202 is partially embedded in the transparent colloidal layer and partially embedded in the transparent conductive oxide layer. The functional layer 23 may be directly deposited on the transparent conductive oxide layer 201', and there is no need to dispose a planar conductive layer. When conductive meshes and a transparent conductive oxide are used to form the composite electrode, a film rectangular resistance loss can be reduced. This avoids a problem of a large film rectangular resistance loss caused by a transparent electrode that uses a TCO, a conductive polymer, or the like alone in a conventional solution.

In an implementation of this application, the conductive region B may be transparent, semi-transparent, or opaque.

Still refer to FIG. 7 and FIG. 8. In an implementation of this application, the conductive region B includes a transparent colloidal layer 201, a second conductive mesh layer 204 embedded in the transparent colloidal layer 201, and a planar conductive layer 203 disposed on the second conductive mesh layer. A structure of the conductive region B is similar to that of the conductive region A. In another implementation of this application, the conductive region B includes a transparent conductive oxide layer and a second conductive mesh layer 204 embedded in the transparent conductive oxide layer. A structure of the conductive region B is similar to that of the conductive region A. The second conductive mesh layer 204 in the conductive region B is connected to the first conductive mesh layer 201 in the conductive region A, to implement electrical connection. The transparent colloidal layer in the conductive region B and the transparent colloidal layer 201 in the conductive region A have a same material selection range, and a material of the transparent colloidal layer in the conductive region B may be the same as or different from a material of the transparent colloidal layer in the conductive region A. The transparent conductive oxide layer in the conductive region B and the transparent conductive oxide layer in the conductive region A have a same material selection range, and a material of the transparent conductive oxide layer in the conductive region B may be the same as or different from a material of the transparent conductive oxide layer in the conductive region A. A material of the second conductive mesh layer 204 may be the same as or different from a material of the first conductive mesh layer 202.

In some implementations of this application, the conductive region A and the conductive region B each use a conductive mesh structure, that is, the entire front electrode uses a conductive mesh structure. In this way, the conductive region A and the conductive region B of the front electrode may be simultaneously manufactured by using a one-step molding process, to simplify a process flow. In this implementation, to make the conductivity of the conductive region B higher than the conductivity of the conductive region A, a conductivity difference may be implemented by designing the first conductive mesh layer and the second conductive mesh layer differently from perspectives of material selection, a mesh line width, a depth, a mesh period, a side length, and the like. A specific design manner is not limited.

Figure 10:
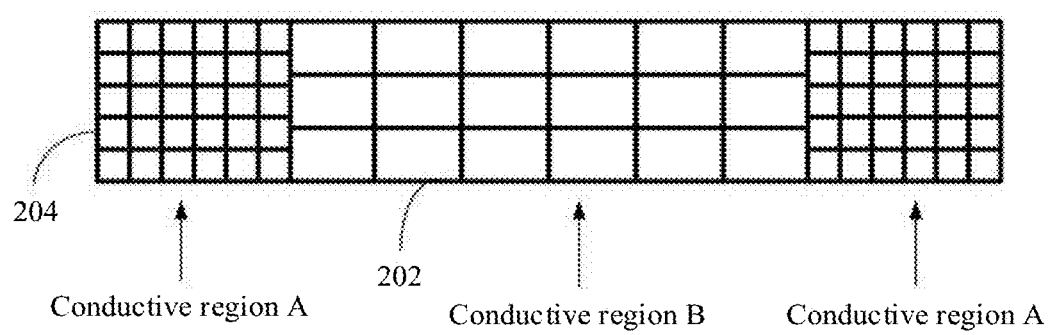
FIG. 10 is a schematic diagram of conductive mesh structures of a conductive region A and a conductive region B of a front electrode 21 according to an embodiment of this application.

In some implementations of this application, area coverage of the second conductive mesh layer 204 in the conductive region B is greater than area coverage of the first conductive mesh layer 202 in the conductive region A, that is, in unit area, an area of a region that is of the conductive region B and that is covered by mesh lines is greater than an area of a region that is of the conductive region A and that is covered by mesh lines. Specifically, for example, as shown in FIG. 10. FIG. 10 is a schematic diagram of conductive mesh structures of the conductive region A and the conductive region B according to an embodiment of this application. A mesh period or a side length of the second conductive mesh layer 204 in the conductive region B is less than a mesh period or a side length of the first conductive mesh layer 202 in the conductive region A. In this way, mesh line distribution of the conductive region B in unit area is denser. When the first conductive mesh layer and the second conductive mesh layer are the same in material, mesh line width, and depth, the conductivity of the conductive region B can be better than the conductivity of the conductive region A, so that the conductive region B converges a photocurrent of the conductive region A. For example, the first conductive mesh layer and the second conductive mesh layer are the same in material, mesh line width, and depth, the mesh period of the first conductive mesh layer is a square with a side length of 80 µm, and the mesh period of the second conductive mesh layer is a square with a side length of 20 µm.

In some other implementations of this application, a mesh line depth-to-width ratio of the second conductive mesh layer 204 is greater than a mesh line depth-to-width ratio of the first conductive mesh layer 202. The mesh line depth-to-width ratio is a ratio of a mesh line width to a mesh line depth (namely, a height or a thickness). When the conductive mesh material fills the mesh grooves in the transparent colloidal layer exactly, a mesh line depth is a depth of the mesh groove. The mesh line width may be at a micrometer level, for example, may be specifically 0.5 µm to 10 µm. The mesh line depth may be at a micrometer level, for example, may be specifically 1 µm to 15 µm.

Figure 11:
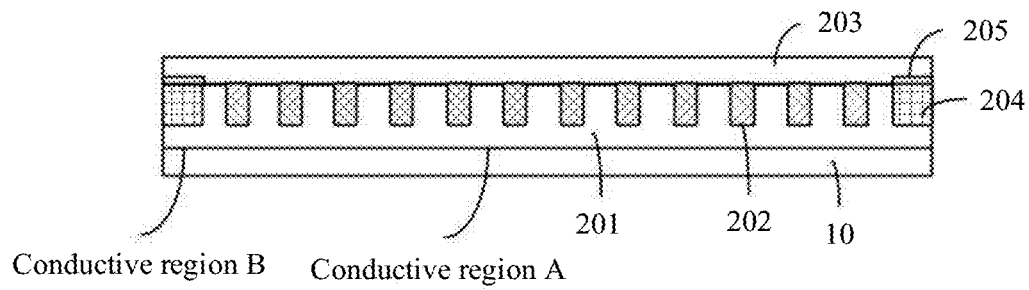
FIG. 11 is a schematic diagram of a cross-sectional structure of a front electrode 21 according to still another implementation of this application.

Refer to FIG. 11. In some other implementations of this application, to make the conductivity of the conductive region B higher than the conductivity of the conductive region A, a conductive modification layer 205 may be further disposed on the second conductive mesh layer 204 in the conductive region B. Specifically, the conductive region B further includes the conductive modification layer 205 disposed on the second conductive mesh layer, and the conductive modification layer 205 is located between the second conductive mesh layer 204 and the planar conductive layer 203. When the conductive modification layer 205 is used to form a conductivity difference between the two regions, the first conductive mesh layer and the second conductive mesh layer may be completely the same (including a same patterned structure and a same material), to facilitate manufacture. A material of the conductive modification layer 205 includes but is not limited to one of or a combination of more of a metal layer or an alloy layer, and a metal nanowire. A metal or alloy may include one or more of gold, silver, nickel, copper, aluminum, or the like. A thickness of the conductive modification layer 205 may be 10 nm to 100 nm. The conductive modification layer 205 may facilitate conductive performance of the second conductive mesh layer 204. The conductive modification layer 205 may cover the entire conductive region B.

In another implementation of this application, the conductive region B includes one or more of a metal layer or an alloy layer, a metal nanowire, graphene, a carbon nanotube, or a conductive polymer. The metal or alloy layer may include one or more of gold, silver, nickel, copper, aluminum, or the like. The metal or alloy layer may be of a single-layer structure including one metal or alloy, or may be of a multi-layer structure including a plurality of different metals or alloys. In an embodiment, the conductive region B includes the metal or alloy layer, and the conductive region B is a metal electrode or an alloy electrode.

In an implementation of this application, the conductive region C of the back electrode 22 may be transparent or semi-transparent.

Figure 12:
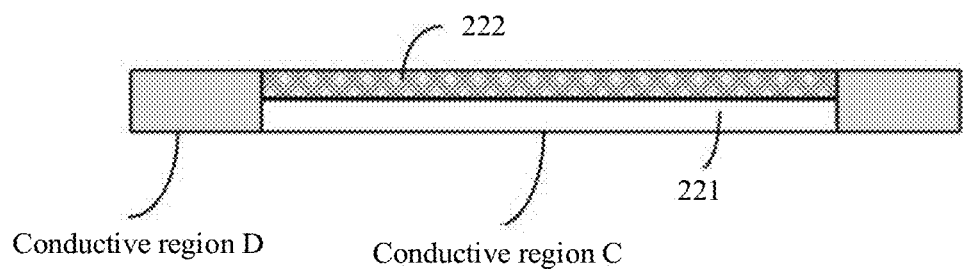
FIG. 12 is a schematic diagram of a cross-sectional structure of a back electrode 22 according to an implementation of this application.
Figure 13:
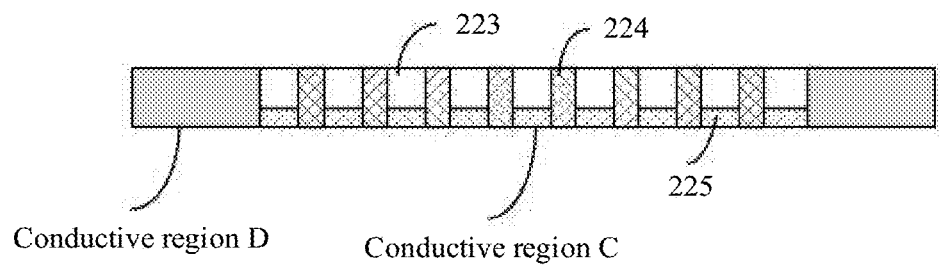
FIG. 13 is a schematic diagram of a cross-sectional structure of a back electrode 22 according to another implementation of this application.

Refer to FIG. 7, FIG. 12, and FIG. 13. In an implementation of this application, the conductive region C includes a first layer 221 and a second layer 222 that are stacked, where the first layer 221 is a thin metal or alloy layer, and the second layer 222 is a transparent conductive oxide layer or a metal oxide layer. That is, the conductive region C may be a composite electrode formed by a thin metal or alloy and a transparent conductive oxide, for example, may be an Ag/ITO composite electrode, an Mg:Ag/ITO composite electrode, or a Ca/ITO composite electrode, or may be a composite electrode formed by a thin metal or alloy and a metal oxide. The metal oxide layer may include one or more of molybdenum oxide, zinc oxide, or tungsten oxide. Specifically, for example, the molybdenum oxide, the zinc oxide, and the tungsten oxide may be molybdenum trioxide, zinc oxide, and tungsten trioxide. A film rectangular resistance loss can be reduced by using a thin metal or alloy electrode, the composite electrode formed by the thin metal or alloy and the transparent conductive oxide, or the composite electrode formed by the thin metal or alloy and the metal oxide.

In another implementation of this application, the first layer 221 is a barrier layer, and the second layer 222 is the transparent conductive oxide layer. The barrier layer includes an organic barrier material and/or an inorganic barrier material. The film rectangular resistance loss can be reduced by using a composite electrode formed by the transparent conductive oxide and the organic or inorganic barrier layer. The organic barrier material includes but is not limited to copper phthalocyanine (CuPc), bathocuproine (BCP), and zinc phthalocyanine (ZnPc). The inorganic barrier material includes but is not limited to lithium metal (Li) and lithium fluoride.

Refer to FIG. 13. In still another implementation of this application, the conductive region C includes a transparent colloidal layer 223 and a third conductive mesh layer 224 embedded in the transparent colloidal layer 223. In an implementation of this application, the third conductive mesh layer 224 is combined with and electrically connected to the functional layer 23 by using a conductive adhesive layer 225. To be specific, the conductive region C is a transparent conductive mesh composite electrode embedded with transparent colloid, and the transparent composite electrode may be manufactured in a transfer manner. The third conductive mesh layer 224 of the transparent composite electrode may implement mechanical bonding and close electrical contact with the functional layer 23 by using the conductive adhesive layer 225. The conductive adhesive layer includes a conductive and adhesive material. A specific material is not limited. Optionally, the conductive adhesive layer may include a conductive adhesive. Specifically, for example, the conductive adhesive layer may include PEDOT:PSS doped with D-sorbitol, where PEDOT is a polymer of EDOT (3,4-ethylenedioxythiophene), and PSS is sodium polystyrene sulfonate. When conductive meshes and the transparent colloid are used to form the composite electrode, a film rectangular resistance loss can be reduced.

In still another implementation of this application, refer to FIG. 13. The conductive region C includes a transparent conductive oxide layer 223 and a third conductive mesh layer 224 embedded in the transparent conductive oxide layer 223. In this implementation of this application, the third conductive mesh layer 224 is combined with and electrically connected to the functional layer 23 by using a conductive adhesive layer 225. To be specific, the conductive region C is a transparent conductive mesh composite electrode embedded with a TCO, and the transparent composite electrode may be manufactured in a transfer manner. The third conductive mesh layer of the transparent composite electrode may implement mechanical bonding and close electrical contact with the functional layer 23 by using the conductive adhesive layer 225. Specific selection of the conductive adhesive layer is not limited to the foregoing descriptions.

In some implementations of this application, the conductive region C includes a thin metal or alloy, that is, the conductive region C uses a thin metal or alloy electrode. A thin metal or alloy layer may include one or more of gold, silver, nickel, copper, aluminum, or the like.

In an implementation of this application, the conductive region D may be transparent, semi-transparent, or opaque. A thickness of the conductive region D may be the same as or different from a thickness of the conductive region C. When the conductive region D is designed to be opaque, a light loss can be reduced, and comprehensive photoelectric conversion efficiency of the large-area thin-film solar cell can be improved. Specifically, in an embodiment, if the conductive region D is opaque and the conductive region C is semi-transparent, a thin-film solar cell with mixed transmittance can be formed.

Figure 14:
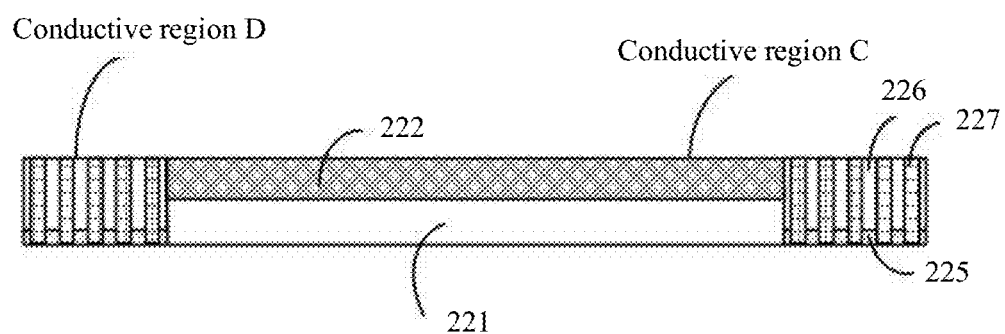
FIG. 14 is a schematic diagram of a cross-sectional structure of a back electrode 22 according to still another implementation of this application.

Refer to FIG. 7 and FIG. 14. In an implementation of this application, the conductive region D includes a transparent conductive oxide layer 226 and a fourth conductive mesh layer 227 embedded in the transparent conductive oxide layer 226, or includes a transparent colloidal layer 226 and a fourth conductive mesh layer 227 embedded in the transparent colloidal layer 226. To be specific, the conductive region D is a transparent conductive mesh composite electrode embedded with transparent colloid or a transparent conductive oxide, and the transparent composite electrode may be manufactured in a transfer manner. The fourth conductive mesh layer 227 of the transparent composite electrode may implement mechanical bonding and close electrical contact with the functional layer 23 by using a conductive adhesive layer 225. When the conductive region A and the conductive region B of the front electrode 21 also use the conductive mesh structures, a conductive mesh structure of the conductive region D may be manufactured together with that of the front electrode 21, thereby simplifying a conductive mesh layer manufacturing process.

Figure 15:
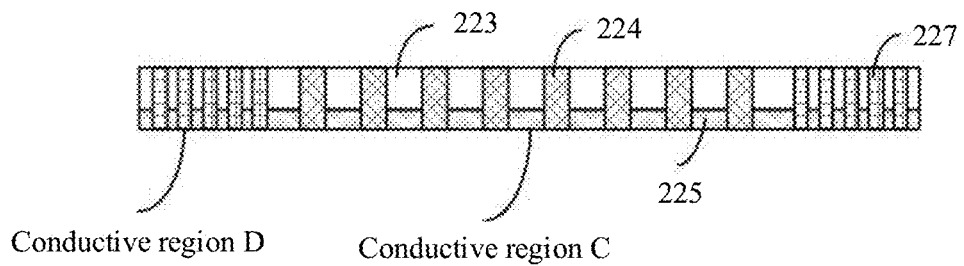
FIG. 15 is a schematic diagram of a cross-sectional structure of a back electrode 22 according to still another implementation of this application.

Refer to FIG. 15. In some implementations, the conductive region C and the conductive region D each use a conductive mesh structure. Similarly, similar to the front electrode, the conductive region C and the conductive region D each use the conductive mesh structure. In this case, to make the conductivity of the conductive region D higher than the conductivity of the conductive region C, a conductivity difference may be implemented by designing the third conductive mesh layer and the fourth conductive mesh layer differently, and a specific design manner is not limited. For details, refer to the designs of the first conductive mesh layer and the second conductive mesh layer of the front electrode. For example, in some implementations, area coverage of the fourth conductive mesh layer 227 in the conductive region D is greater than area coverage of the third conductive mesh layer 224 in the conductive region C. In some other implementations, a mesh line depth-to-width ratio of the fourth conductive mesh layer 227 is greater than a mesh line depth-to-width ratio of the third conductive mesh layer 224. In some other implementations, a conductive modification layer may be further disposed on the fourth conductive mesh layer in the conductive region D. That is, the conductive region D further includes the conductive modification layer disposed on the fourth conductive mesh layer. A material of the conductive modification layer includes but is not limited to one of or a combination of more of a metal layer or an alloy layer and a metal nanowire. The metal or alloy may include one or more of gold, silver, nickel, copper, aluminum, or the like. The conductive modification layer is located between the conductive adhesive layer and the fourth conductive mesh layer.

Refer to FIG. 12 and FIG. 13. In another implementation of this application, the conductive region D includes one or more of a metal layer or an alloy layer, a metal nanowire, graphene, a carbon nanotube, or a conductive polymer. The metal or alloy layer may include one or more of gold, silver, nickel, copper, aluminum, or the like. The metal or alloy layer may be of a single-layer structure including one metal or alloy, or may be of a multi-layer structure including a plurality of different metals or alloys. In an embodiment, the conductive region B includes the metal or alloy layer, and the conductive region D is a metal electrode or an alloy electrode. The conductivity and transparency of the conductive region D can be adjusted by adjusting a thickness of a film layer.

In the foregoing embodiment of this application, an example in which the front electrode 21 is combined with the functional layer 23 first and then the back electrode 22 is combined with the functional layer 23 is used for description. When the front electrode and the back electrode each include a conductive mesh structure, optionally, a conductive mesh layer of the front electrode is combined with the functional layer by using a planar conductive layer (the conductive mesh layer of the front electrode may be embedded in a transparent colloidal layer) or the functional layer is directly deposited on the conductive mesh layer to be in contact with, stacked with, and combined with the functional layer (the conductive mesh layer of the front electrode may be embedded in a transparent conductive oxide layer), and a conductive mesh layer of the back electrode is combined with the functional layer by using a conductive adhesive layer. In some other embodiments of this application, when the front electrode and the back electrode each include a conductive mesh structure, if the back electrode 22 is combined with the functional layer 23 first and then the front electrode 21 is combined with the functional layer 23, that is, the back electrode 22, the functional layer 23, and the front electrode 21 are successively formed on the substrate, optionally, a conductive mesh layer of the back electrode is combined with the functional layer by using a planar conductive layer (the conductive mesh layer of the back electrode may be embedded in a transparent colloidal layer) or is directly in contact with, stacked with, and combined with the functional layer (the conductive mesh layer of the back electrode may be embedded in a transparent conductive oxide layer), and a conductive mesh layer of the front electrode is combined with the functional layer by using a conductive adhesive layer. Details are not described herein again. An electrode that is later combined with the functional layer is combined with the functional layer by using a conductive adhesive layer instead of being directly manufactured on the functional layer. This can prevent the functional layer from being damaged by directly manufacturing the other electrode on the functional layer.

In an implementation of this application, a material of the conductive mesh layer is a material having good conductive performance. Optionally, a conductive mesh material of each of the first conductive mesh layer 202, the second conductive mesh layer 204, the third conductive mesh layer 224, and the fourth conductive mesh layer 227 may include one of or a combination of more of a metal layer or an alloy layer, a conductive polymer, a carbon nanotube, graphene, and a metal nanowire. The metal or alloy may include one or more of gold, silver, nickel, copper, aluminum, or the like. When the metal or alloy layer is included, the metal or alloy layer may be a single-layer structure including one metal or alloy, or may be a multi-layer structure including a plurality of different metals or alloys. For example, the conductive mesh layer includes a silver layer and a copper layer that are stacked, that is, the conductive mesh layer is of a double-layer structure including silver and copper.

In an implementation of this application, a specific structure and a specific material of the functional layer 23 are not limited. The light absorption layer 232 may be perovskite, an organic semiconductor material, an inorganic semiconductor material, an organic-inorganic mixed semiconductor material, or the like. The internal and external regions of the solar cell lens may use a same functional layer material or different functional layer materials. In addition to including the light absorption layer 232, the first carrier transport layer 231, and the second carrier transport layer 233, the functional layer 23 may further include another interface modification layer and the like. Materials of the first carrier transport layer 231 and the material of the second carrier transport layer 233 may be selected based on a material of the light absorption layer. For example, when the light absorption layer 232 uses PTB7-Th:IEICO-4F, the first carrier transport layer 231 and the second carrier transport layer 233 may be respectively zinc oxide (ZnO), molybdenum oxide ($MoO_3$), or the like.

In an implementation of this application, a front electrode extraction region is disposed in the conductive region B of the front electrode 21, and a back electrode extraction region is disposed in the conductive region D of the back electrode 22. Refer to FIG. 6. The front electrode 21 and the back electrode 22 may be extracted in a manner, for example, as conducting wires, in the extraction regions to serve as positive and negative electrodes of the solar cell for external supply power.

In this application, "–" represents a value range, and the range includes values of both endpoints. For example, a thickness of the transparent colloidal layer 201 may be 2 μm to 20 μm, indicating that the thickness ranges from 2 μm to 20 μm, including values 2 μm and 20 μm of both endpoints.

The following further describes embodiments of this application by using a plurality of embodiments.

Embodiment 1

Figure 16:
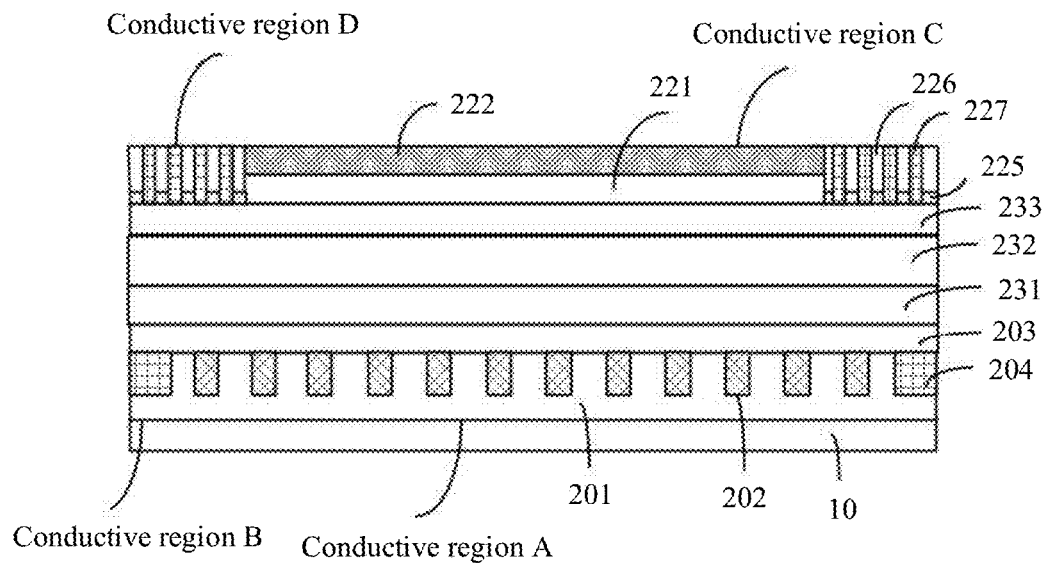
FIG. 16 is a schematic diagram of a cross-sectional structure of a solar cell lens according to an embodiment 1 of this application.

A pair of smart glasses is provided. The pair of smart glasses includes solar cell lenses. For a structure of the solar cell lens, refer to FIG. 16. The solar cell lens includes a lens substrate 10 and a solar cell 20 disposed on the lens substrate 10. A conductive region A of a front electrode 21 of the solar cell 20 uses an Ag/Cu composite metal mesh layer 202 embedded in a transparent colloidal layer 201, where a width of a mesh trench of the metal mesh layer 202 is about 3.5 μm, a depth of the trench is about 3 μm, a silver filling depth of the trench is about 2.3 μm, and a copper plating depth is about 1.0 μm. In addition, metal copper protruding from a surface of the groove is polished, and a step after polishing is less than 10 nm (that is, a height difference between an upper surface of the metal mesh layer 202 and an upper surface of the transparent colloidal layer 201 is less than 10 nm). A trench pattern in the transparent colloidal layer 201 is a regular hexagon with a side length of 85 μm. A conductive region B of the front electrode 21 also uses an Ag/Cu composite metal mesh 204 embedded in a transparent colloidal layer 201, where a width of a trench of the metal mesh 204 is about 5 μm, a depth of the trench is about 3 μm, silver filling is performed for about 2.3 μm in the trench, and copper plating is performed for about 1.0 μm. In addition, polishing is performed, a trench pattern of the conductive region B is a quadrangle with a side length of 20 μm, and a width $W_f$ of the conductive region B is 1 mm. The trench in the conductive region A of the front electrode 21 and the trench in the conductive region B of the front electrode 21 are mutually connected, and conductivity of the conductive region B is greater than conductivity of the conductive region A. A material of a planar conductive layer 203 is ITO, and a thickness is 30 nm. A conductive region C of a back electrode 22 uses an Ag/$MoO_3$ composite electrode, where a thickness of an Ag layer 221 is 10 nm, and a thickness of a $MoO_3$ layer 222 is 30 nm. A conductive region D of the back electrode 22 also uses metal meshes, and parameters are set the same as those of the conductive region B. A width $W_r$ of the conductive region D is the same as a width of a groove of a glasses frame of the pair of smart glasses, and $W_r$ is 1 mm. Conductivity of the conductive region D is greater than conductivity of the conductive region C. A functional layer includes an electron transport layer 231, a light absorption layer 232, and a hole transport layer 233, where the electron transport layer 231 is ZnO and has a thickness of 20 nm; the light absorption layer 232 uses PTB7-Th:IEICO-4F and has a thickness of 110 nm; and the hole transport layer 233 is molybdenum oxide $MoO_3$ and has a thickness of 3 nm. In this embodiment, the conductive region A of the front electrode uses a transparent metal mesh-ITO (the planar conductive layer) composite electrode form. Compared with a conventional form in which a TCO or the like is simply used as a transparent electrode, a rectangular resistance can be reduced by one to two orders of magnitude. In addition, the conductive region B of the front electrode and the conductive region D of the back electrode are respectively used as high-conductivity convergence regions of the front electrode and the back electrode. When both the front electrode and the back electrode use metal mesh forms, a manufacturing process can be simplified. By using a designed imprinting mold, the conductive region B and the conductive region D are manufactured while imprinting the conductive region A. After the functional layer is manufactured, the conductive region C is finally manufactured through evaporation, so that the conductive region C is electrically connected to the conductive region D. In this way, photoelectric conversion efficiency of a manufactured large-area device cell of 30 cm² is 4.92%, average visible light transmittance is 18%, and a power output of about 150 mW can be implemented under a standard illuminance condition. The conductive region B of the front electrode and the conductive region D of the back electrode are extracted as positive and negative electrodes of the solar cell, to implement an electrical connection between the solar cell lens and a glasses temple.

Embodiment 2

Compared with Embodiment 1, an only difference is as follows: The conductive region D of the back electrode is an Al electrode, a thickness of the Al layer is 150 nm, and a width Wr is 1 mm. The conductive region C of the back electrode uses a thin metal/metal oxide composite electrode, and in this embodiment, an $Ag/MoO_3$ composite electrode is used, where a thickness of Ag is 10 nm, and a thickness of $MoO_3$ is 35 nm. In this way, photoelectric conversion efficiency of a manufactured large-area device cell of 30 cm² is more than 2%.

Embodiment 3

Figure 17:
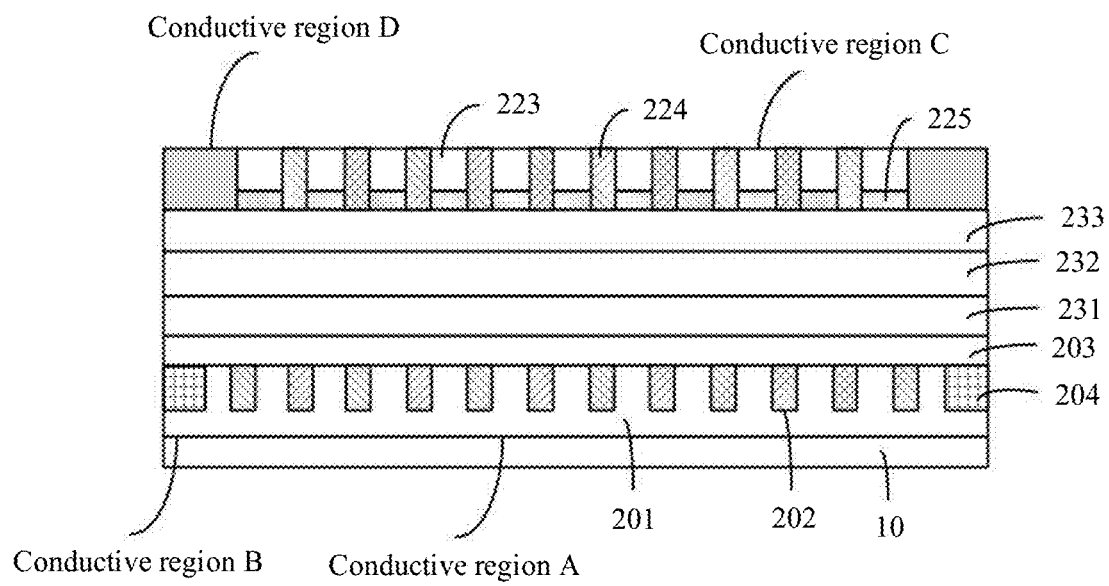
FIG. 17 is a schematic diagram of a cross-sectional structure of a solar cell lens according to an embodiment 3 of this application.

For a structure of the solar cell lens, refer to FIG. 17. Compared with Embodiment 1, an only difference is as follows: The conductive region D of the back electrode 22 is an Al electrode, a thickness of the Al layer is 110 nm, and a width Wr is 1 mm. The conductive region C of the back electrode 22 uses a composite electrode in which metal meshes 224 are embedded in a TCO layer 223, where a TCO uses ITO, a thickness of the ITO layer 223 is 300 nm, a mesh line width of the metal mesh 224 is 1 μm, a depth is 1 μm, a pattern is a regular hexagon, and a side length of the pattern is 85 μm. In this way, photoelectric conversion efficiency of a manufactured large-area device cell of 30 cm² is more than 2%.

Embodiment 4

Compared with Embodiment 1, an only difference is as follows: The conductive region D of the back electrode is an Al electrode, a thickness of the Al layer is 100 nm, and a width Wr is 1 mm. The conductive region C of the back electrode uses an $Ag/MoO_3$ thin metal/metal oxide composite electrode, where a thickness of an Ag layer is 10 nm, and a thickness of a $MoO_3$ layer is 35 nm. The conductive region B of the front electrode uses a form in which metal meshes are embedded in a transparent colloidal layer and a conductive modification layer is deposited on surfaces of the metal meshes, where the metal meshes use Ag/Cu metal meshes, a width of a trench is about 3.5 μm, a depth of the trench is about 3 μm, silver filling is performed for about 2.3 μm in the trench, and copper plating is performed for about 1.0 μm. After polishing is performed, a step is less than 10 nm, and a trench pattern is a regular hexagon with a side length of 85 μm. The conductive modification layer uses Ag, and has a thickness of 50 nm and a width Wr of 1 mm. The trench in the conductive region B of the front electrode and a trench in the conductive region A of the front electrode are mutually connected. Parameters of the mesh trench and a metal mesh in the conductive region A of the front electrode are set the same as parameters of the trench and the metal mesh in the conductive region B. In this way, photoelectric conversion efficiency of a manufactured large-area device cell of 30 cm² is more than 2%.

Comparative Example 1

A semi-transparent thin-film solar cell structure is provided. The semi-transparent thin-film solar cell structure includes stacked glass/indium tin oxide (ITO)/zinc oxide (ZnO)/PBTZT-stat-BDTT-8:PC61BM:PC71BM/PEDOT:PSS, where a front electrode is ITO, and a back electrode is PEDOT:PSS. Average transmittance of a small-area device (0.24 cm²) based on the structure is 24%, and photoelectric conversion efficiency under standard illuminance is 4.8%. For an enlarged large-area device (15.5 cm²), average transmittance is 24%, and photoelectric conversion efficiency under the standard illuminance is 0.06%. Therefore, efficiency is significantly reduced by 80 times. This is directly related to large rectangular resistances of the ITO and the PEDOT:PSS. As an effective area of a solar cell device is enlarged, the large rectangular resistances of the ITO and the PEDOT:PSS cause a significant increase in an equivalent series resistance of the cell, resulting in a large decrease in a fill factor and a short-circuit current. This seriously affects the photoelectric conversion efficiency.

The foregoing describes in detail the solar cell and the electronic device thereof that are provided in embodiments of this application. The description of the foregoing embodiments is merely used to help understand the method and a core idea of this application. In addition, a person of ordinary skill in the art can make variations and modifications in terms of specific embodiments and application scopes according to the idea of this application. In conclusion, the content of the specification should not be construed as a limitation on this application.

What is claimed is:
1. A solar cell, comprising:
   a front electrode on a side of an illuminated surface;

a back electrode;
a functional layer disposed between the front electrode and the back electrode;
wherein the front electrode and the back electrode are disposed opposite to each other;
wherein the front electrode comprises a high-conductivity region and a low-conductivity region that are adjacent to each other, and the back electrode comprises a high-conductivity region and a low-conductivity region that are adjacent to each other;
wherein the low-conductivity region of the front electrode comprises a transparent conductive oxide layer and a first conductive mesh layer embedded in the transparent conductive oxide layer;
wherein the first conductive mesh layer is electrically connected to the functional layer;
wherein the high-conductivity region of the front electrode comprises the transparent conductive oxide layer and a second conductive mesh layer embedded in the transparent conductive oxide layer;
wherein the second conductive mesh layer is electrically connected to the functional layer; and
wherein a side length of the second conductive mesh layer in the high-conductivity region of the front electrode is less than a side length of the first conductive mesh layer in low high-conductivity region of the front electrode.

2. The solar cell according to claim 1, wherein the high-conductivity region of the front electrode is disposed around the low-conductivity region of the front electrode, or the high-conductivity region of the back electrode is disposed around the low-conductivity region of the back electrode.

3. The solar cell according to claim 1, wherein area coverage of the second conductive mesh layer in the high-conductivity region of the front electrode is greater than area coverage of the first conductive mesh layer in the low-conductivity region of the front electrode; or
wherein a mesh line depth-to-width ratio of the second conductive mesh layer is greater than a mesh line depth-to-width ratio of the first conductive mesh layer.

4. The solar cell according to claim 1, wherein the high-conductivity region of the front electrode further comprises a conductive modification layer disposed on the second conductive mesh layer.

5. The solar cell according to claim 1, wherein the front electrode comprises a transparent colloidal layer, and the front electrode further comprises a planar conductive layer or a conductive adhesive layer disposed between the transparent colloidal layer and the functional layer.

6. The solar cell according to claim 1, wherein the second conductive mesh layer in the high-conductivity region of the front electrode comprises one or more of a metal layer or an alloy layer, a metal nanowire, graphene, a carbon nanotube, or a conductive polymer.

7. The solar cell according to claim 1, wherein the low-conductivity region of the back electrode comprises a metal layer or an alloy layer; or
wherein the low-conductivity region of the back electrode comprises a metal layer or an alloy layer, and a transparent conductive oxide layer or a metal oxide layer stacked with the metal or alloy layer; or
wherein the low-conductivity region of the back electrode comprises a transparent conductive oxide layer and a barrier layer; and
wherein the metal oxide layer comprises one or more of molybdenum oxide, zinc oxide, or tungsten oxide, and the barrier layer comprises an organic barrier material and/or an inorganic barrier material.

8. The solar cell according to claim 1, wherein the low-conductivity region of the back electrode comprises a transparent colloidal layer and a third conductive mesh layer embedded in the transparent colloidal layer, or comprises a transparent conductive oxide layer and a third conductive mesh layer embedded in the transparent conductive oxide layer; and
wherein the third conductive mesh layer is electrically connected to the functional layer.

9. The solar cell according to claim 8, wherein the high-conductivity region of the back electrode comprises a transparent colloidal layer and a fourth conductive mesh layer embedded in the transparent colloidal layer, or comprises a transparent conductive oxide layer and a fourth conductive mesh layer embedded in the transparent conductive oxide layer; and
wherein the fourth conductive mesh layer is electrically connected to the functional layer.

10. The solar cell according to claim 8, wherein the high-conductivity region of the back electrode comprises the transparent colloidal layer and a fourth conductive mesh layer embedded in the transparent colloidal layer, or comprises the transparent conductive oxide layer and a fourth conductive mesh layer embedded in the transparent conductive oxide layer; and
wherein the fourth conductive mesh layer is electrically connected to the functional layer.

11. The solar cell according to claim 10, wherein area coverage of the fourth conductive mesh layer in the high-conductivity region of the back electrode is greater than area coverage of the third conductive mesh layer in the low-conductivity region of the back electrode; or
wherein a mesh line depth-to-width ratio of the fourth conductive mesh layer is greater than a mesh line depth-to-width ratio of the third conductive mesh layer.

12. The solar cell according to claim 7, wherein the high-conductivity region of the back electrode comprises one or more of a metal layer or an alloy layer, a metal nanowire, graphene, a carbon nanotube, or a conductive polymer.

13. The solar cell according to claim 1, wherein the front electrode comprises a transparent colloidal layer, and the front electrode further comprises a planar conductive layer or a conductive adhesive layer disposed between the transparent colloidal layer and the functional layer.

14. The solar cell according to claim 3, wherein the front electrode comprises a transparent colloidal layer, and the front electrode further comprises a planar conductive layer or a conductive adhesive layer disposed between the transparent colloidal layer and the functional layer.

15. The solar cell according to claim 4, wherein the front electrode comprises a transparent colloidal layer, and the front electrode further comprises a planar conductive layer or a conductive adhesive layer disposed between the transparent colloidal layer and the functional layer.

16. An electronic device, comprising a solar cell, which comprises:
a front electrode on a side of an illuminated surface;
a back electrode;
a functional layer disposed between the front electrode and the back electrode;
wherein the front electrode and the back electrode are disposed opposite to each other;
wherein the front electrode comprises a high-conductivity region and a low-conductivity region that are adjacent to each other, and the back electrode comprises a high-conductivity region and a low-conductivity region that are adjacent to each other; and wherein the solar cell is configured to supply power to the electronic device;

wherein the low-conductivity region of the front electrode comprises a transparent conductive oxide layer and a first conductive mesh layer embedded in the transparent conductive oxide layer;

wherein the first conductive mesh layer is electrically connected to the functional layer;

wherein the high-conductivity region of the front electrode comprises the transparent conductive oxide layer and a second conductive mesh layer embedded in the transparent conductive oxide layer;

wherein the second conductive mesh layer is electrically connected to the functional layer; and wherein a side length of the second conductive mesh laver in the high-conductivity region of the front electrode is less than a side length of the first conductive mesh laver in low high-conductivity region of the front electrode.

17. A pair of smart glasses, wherein the pair of smart glasses comprises a power consumption module and a solar cell, which comprises:
a front electrode one a side of an illuminated surface;
a back electrode;
a functional layer disposed between the front electrode and the back electrode;
wherein the front electrode and the back electrode are disposed opposite to each other;
wherein the front electrode comprises a high-conductivity region and a low-conductivity region that are adjacent to each other, and the back electrode comprises a high-conductivity region and a low-conductivity region that are adjacent to each other; and wherein the solar cell supplies power to the power consumption module;

wherein the low-conductivity region of the front electrode comprises a transparent conductive oxide layer and a first conductive mesh layer embedded in the transparent conductive oxide layer;

wherein the first conductive mesh layer is electrically connected to the functional layer;

wherein the high-conductivity region of the front electrode comprises the transparent conductive oxide layer and a second conductive mesh layer embedded in the transparent conductive oxide layer;

wherein the second conductive mesh layer is electrically connected to the functional layer; and wherein a side length of the second conductive mesh laver in the high-conductivity region of the front electrode is less than a side length of the first conductive mesh laver in low high-conductivity region of the front electrode.

18. The electronic device according to claim 16, wherein the high-conductivity region of the front electrode is disposed around the low-conductivity region of the front electrode, or the high-conductivity region of the back electrode is disposed around the low-conductivity region of the back electrode.

19. The pair of smart glasses according to claim 17, wherein the high-conductivity region of the front electrode is disposed around the low-conductivity region of the front electrode, or the high-conductivity region of the back electrode is disposed around the low-conductivity region of the back electrode.

20. The solar cell according to claim 1, wherein the high-conductivity region of the front electrode is configured to converge a photocurrent of the low-conductivity region of the front electrode.

* * * * *

UNITED STATES PATENT AND TRADEMARK OFFICE
CERTIFICATE OF CORRECTION

| | | |
|---|---|---|
| PATENT NO. | : 11,961,923 B2 | |
| APPLICATION NO. | : 17/725310 | |
| DATED | : April 16, 2024 | |
| INVENTOR(S) | : Wang et al. | |

It is certified that error appears in the above-identified patent and that said Letters Patent is hereby corrected as shown below:

In the Claims

Claim 1: Column 27, Line 26: "less than a side length of the first conductive mesh laver" should read -- less than a side length of the first conductive mesh layer --.

Claim 6: Column 27, Line 52: "conductive mesh laver in the high-conductivity region of the" should read -- conductive mesh layer in the high-conductivity region of the --.

Claim 16: Column 29, Line 18: "wherein a side length of the second conductive mesh laver" should read -- wherein a side length of the second conductive mesh layer --.

Claim 16: Column 29, Line 20: "less than a side length of the first conductive mesh laver" should read -- less than a side length of the first conductive mesh layer --.

Claim 17: Column 30, Line 15: "wherein a side length of the second conductive mesh laver" should read -- wherein a side length of the second conductive mesh layer --.

Claim 17: Column 30, Line 17: "less than a side length of the first conductive mesh laver" should read -- less than a side length of the first conductive mesh layer --.

Signed and Sealed this
Twentieth Day of August, 2024

Katherine Kelly Vidal
*Director of the United States Patent and Trademark Office*